(12) United States Patent
Variot et al.

(10) Patent No.: US 12,040,284 B2
(45) Date of Patent: Jul. 16, 2024

(54) 3D-INTERCONNECT WITH ELECTROMAGNETIC INTERFERENCE ("EMI") SHIELD AND/OR ANTENNA

(71) Applicant: Invensas LLC, San Jose, CA (US)

(72) Inventors: Patrick Variot, Los Gatos, CA (US); Hong Shen, Palo Alto, CA (US)

(73) Assignee: Invensas LLC, San Jose, CA (US)

( * ) Notice: Subject to any disclaimer, the term of this patent is extended or adjusted under 35 U.S.C. 154(b) by 435 days.

(21) Appl. No.: 17/525,559

(22) Filed: Nov. 12, 2021

(65) Prior Publication Data
US 2023/0154862 A1 May 18, 2023

(51) Int. Cl.
H01L 23/552 (2006.01)
H01L 21/56 (2006.01)
H01L 25/065 (2023.01)
H01Q 1/38 (2006.01)

(52) U.S. Cl.
CPC ............ *H01L 23/552* (2013.01); *H01L 21/56* (2013.01); *H01L 25/0655* (2013.01); *H01Q 1/38* (2013.01)

(58) Field of Classification Search
CPC ....... H01L 23/552; H01L 23/66; H01L 21/56; H01L 25/0655; H01L 25/105; H01L 24/20
See application file for complete search history.

(56) References Cited

U.S. PATENT DOCUMENTS 3,968,500 A  7/1976  Meisel et al.
4,700,276 A  10/1987 Freyman et al.
4,829,403 A  5/1989  Harding
4,855,868 A  8/1989  Harding
5,030,796 A  7/1991  Swanson et al.
(Continued)

FOREIGN PATENT DOCUMENTS

CN  1292635 A  4/2001
EP  1093329 A2  4/2001
(Continued)

OTHER PUBLICATIONS

Chia, et al., U.S. Appl. No. 17/340,469, filed Jun. 7, 2021, titled "3d-Interconnect".
(Continued)

*Primary Examiner* — Marc Anthony Armand
(74) *Attorney, Agent, or Firm* — Haley Guiliano LLP

(57) ABSTRACT

A method of manufacturing a microelectronic package with an integrally formed electromagnetic interference ("EMI") shield and/or antenna is disclosed. The method comprises patterning a conductive structure to comprise a base, a plurality of interconnection elements, and a die attach area sized to receive a microelectronic element; bonding ends of the plurality of interconnection elements to a carrier; encapsulating the plurality of interconnection elements, and the microelectronic element with an encapsulant; removing the carrier to expose free ends of the plurality of interconnection elements; patterning the exposed outer surface of the conductive structure overlying the microelectronic element to form a portion of the EMI shield structure and/or an antenna. The portion of the EMI shield structure and/or antenna can be patterned to extend continuously from one or more of the plurality of interconnection elements.

20 Claims, 18 Drawing Sheets

(56) References Cited

U.S. PATENT DOCUMENTS

| | | | |
|---|---|---|---|
| 5,406,117 A | 4/1995 | Dlugokecki et al. |
| 5,454,161 A | 10/1995 | Beilin et al. |
| 5,455,390 A | 10/1995 | DiStefano et al. |
| 5,483,421 A | 1/1996 | Gedney et al. |
| 5,629,241 A | 5/1997 | Matloubian et al. |
| 5,932,254 A | 8/1999 | Mitchell et al. |
| 5,990,418 A | 11/1999 | Bivona et al. |
| 5,998,861 A | 12/1999 | Hiruta |
| 6,046,910 A | 4/2000 | Ghaem et al. |
| 6,107,679 A | 8/2000 | Noguchi |
| 6,126,428 A | 10/2000 | Mitchell et al. |
| 6,127,724 A | 10/2000 | DiStefano |
| 6,159,767 A | 12/2000 | Eichelberger |
| 6,228,676 B1 | 5/2001 | Glenn et al. |
| 6,255,738 B1 | 7/2001 | Distefano et al. |
| 6,365,975 B1 | 4/2002 | DiStefano et al. |
| 6,373,273 B2 | 4/2002 | Akram et al. |
| 6,602,740 B1 | 8/2003 | Mitchell |
| 6,646,337 B2 | 11/2003 | Iijima et al. |
| 6,873,039 B2 | 3/2005 | Beroz et al. |
| 7,060,761 B2 | 6/2006 | Arai et al. |
| 7,501,839 B2 | 3/2009 | Chan et al. |
| 7,510,912 B2 | 3/2009 | Caletka et al. |
| 7,553,752 B2 | 6/2009 | Kuan et al. |
| 7,619,901 B2 | 11/2009 | Eichelberger et al. |
| 7,749,882 B2 | 7/2010 | Kweon et al. |
| 7,759,782 B2 | 7/2010 | Haba et al. |
| 7,776,649 B1 | 8/2010 | Fan |
| 8,035,192 B2 | 10/2011 | Fujii |
| 8,071,424 B2 | 12/2011 | Haba et al. |
| 8,093,705 B2 | 1/2012 | Park et al. |
| 8,164,158 B2 | 4/2012 | Lin |
| 8,304,915 B2 | 11/2012 | Mori et al. |
| 8,372,689 B2 | 2/2013 | Lee et al. |
| 8,379,400 B2 | 2/2013 | Sunohara |
| 8,421,210 B2 | 4/2013 | Chi et al. |
| 8,482,111 B2 | 7/2013 | Haba |
| 8,492,203 B2 | 7/2013 | Lin et al. |
| 8,557,700 B2 | 10/2013 | Ishihara |
| 8,641,913 B2 | 2/2014 | Haba et al. |
| 8,692,135 B2 | 4/2014 | Funaya et al. |
| 8,709,933 B2 | 4/2014 | Haba et al. |
| 8,736,066 B2 | 5/2014 | Oganesian et al. |
| 8,841,765 B2 | 9/2014 | Haba et al. |
| 8,883,563 B1 | 11/2014 | Haba et al. |
| 8,884,427 B2 | 11/2014 | Woychik et al. |
| 8,900,922 B2 | 12/2014 | Lin et al. |
| 8,928,132 B2 | 1/2015 | Choi et al. |
| 8,945,998 B2 | 2/2015 | Hsu et al. |
| 8,946,884 B2 | 2/2015 | Kwon et al. |
| 8,978,247 B2 | 3/2015 | Yang et al. |
| 9,064,718 B1 | 6/2015 | Muniandy et al. |
| 9,984,961 B2 | 5/2018 | Ishihara |
| 10,181,447 B2 | 1/2019 | Chia et al. |
| 11,031,362 B2 | 6/2021 | Chia et al. |
| 2003/0116857 A1 | 6/2003 | Taniguchi et al. |
| 2003/0151067 A1 | 8/2003 | Iijima et al. |
| 2003/0155603 A1 | 8/2003 | Liu et al. |
| 2005/0093152 A1 | 5/2005 | Fjelstad et al. |
| 2005/0142842 A1 | 6/2005 | Jung |
| 2006/0022332 A1 | 2/2006 | Koyama et al. |
| 2006/0040428 A1 | 2/2006 | Johnson |
| 2006/0076671 A1 | 4/2006 | Kariya et al. |
| 2006/0202322 A1 | 9/2006 | Kariya et al. |
| 2007/0023888 A1 | 2/2007 | Fujii |
| 2007/0176281 A1* | 8/2007 | Kim ................... H01L 25/0655 257/700 |
| 2007/0241463 A1 | 10/2007 | Yamaguchi et al. |
| 2008/0003402 A1 | 1/2008 | Haba et al. |
| 2008/0007927 A1 | 1/2008 | Ito et al. |
| 2008/0087459 A1 | 4/2008 | Das et al. |
| 2008/0090333 A1 | 4/2008 | Haba et al. |
| 2008/0108178 A1 | 5/2008 | Wilson et al. |
| 2008/0155820 A1 | 7/2008 | Arai et al. |
| 2008/0265430 A1 | 10/2008 | Ishihara |
| 2008/0289867 A1 | 11/2008 | Owens |
| 2008/0315372 A1 | 12/2008 | Kuan et al. |
| 2009/0115047 A1 | 5/2009 | Haba et al. |
| 2009/0166811 A1 | 7/2009 | Fujii |
| 2010/0071940 A1 | 3/2010 | Ejiri et al. |
| 2010/0102426 A1 | 4/2010 | Park et al. |
| 2010/0237477 A1 | 9/2010 | Pagaila et al. |
| 2010/0273293 A1 | 10/2010 | Haba et al. |
| 2010/0320582 A1 | 12/2010 | Pagaila et al. |
| 2010/0327421 A1 | 12/2010 | Luan |
| 2011/0045634 A1* | 2/2011 | Pagaila ................... H01L 24/96 438/107 |
| 2011/0057325 A1 | 3/2011 | Ishihara |
| 2011/0062549 A1 | 3/2011 | Lin |
| 2011/0155433 A1 | 6/2011 | Funaya et al. |
| 2012/0112327 A1 | 5/2012 | Pagaila et al. |
| 2012/0139082 A1 | 6/2012 | Oganesian et al. |
| 2012/0211885 A1 | 8/2012 | Choi et al. |
| 2012/0280386 A1 | 11/2012 | Sato et al. |
| 2013/0050972 A1 | 2/2013 | Mohammed et al. |
| 2013/0093097 A1 | 4/2013 | Yu et al. |
| 2013/0161833 A1 | 6/2013 | Pendse |
| 2013/0224914 A1 | 8/2013 | Co et al. |
| 2013/0313012 A1 | 11/2013 | Yang et al. |
| 2014/0048951 A1 | 2/2014 | Lin et al. |
| 2014/0077389 A1 | 3/2014 | Shim et al. |
| 2014/0239479 A1 | 8/2014 | Start |
| 2015/0115458 A1 | 4/2015 | Palm |
| 2015/0206815 A1 | 7/2015 | Katkar |
| 2015/0270232 A1 | 9/2015 | Chen et al. |
| 2015/0279823 A1 | 10/2015 | Haba et al. |
| 2016/0079214 A1 | 3/2016 | Caskey et al. |
| 2016/0133686 A1 | 5/2016 | Liao et al. |
| 2017/0162556 A1 | 6/2017 | Lin et al. |
| 2017/0178993 A1 | 6/2017 | Meyer et al. |
| 2018/0130759 A1 | 5/2018 | Ho et al. |
| 2018/0315674 A1 | 11/2018 | Chen et al. |

FOREIGN PATENT DOCUMENTS

| | | | |
|---|---|---|---|
| EP | 2555240 A1 | 2/2013 |
| JP | 2001007248 A | 1/2001 |
| JP | 2002050870 A | 2/2002 |
| JP | 3311215 B2 | 8/2002 |
| JP | 2005038898 A | 2/2005 |
| JP | 2005136187 A | 5/2005 |
| JP | 2006210758 A | 8/2006 |
| JP | 2007250561 A | 9/2007 |
| KR | 20010094893 A | 11/2001 |
| KR | 20060111449 A | 10/2006 |
| KR | 20070102481 A | 10/2007 |
| TW | 512467 B | 12/2002 |
| TW | 200512843 A | 4/2005 |
| WO | 2005059993 A2 | 6/2005 |
| WO | 2005101475 A1 | 10/2005 |
| WO | 2009136495 A1 | 11/2009 |

OTHER PUBLICATIONS

Chinese Office Action for Application No. 201280030721.6 dated Oct. 8, 2014.

http://fwww.casio-micronics.co.jp/productfw_csp.html, home page of Casio Micronics Co., Ltd., "W-CSP", Sep. 24, 2010.

International Search Report and Written Opinion for Application No. PCT/JP2009/001998 dated Jun. 23, 2009.

International Search Report and Written Opinion for Application No. PCT/US2012/034209 dated Jul. 20, 2012.

International Search Report and Written Opinion for Application No. PCT/US2014/027699 dated Jul. 17, 2014.

Taiwanese Office Action for Application No. 101114254 dated Nov. 6, 2013.

* cited by examiner

3D-INTERCONNECT WITH ELECTROMAGNETIC INTERFERENCE ("EMI") SHIELD AND/OR ANTENNA

BACKGROUND OF THE INVENTION

The subject matter of the present application relates to microelectronic assemblies and fabrication methods, and more particularly to the structure of and fabrication method for conductive components in a low-profile microelectronic package assembly that include electromagnetic interference ("EMI") structures and/or antennas.

Semiconductor chips are commonly provided as individual, prepackaged units. A standard chip has a flat, rectangular body with a large front face having contacts connected to the internal circuitry of the chip. Each individual chip typically is mounted in a package which, in turn, is mounted on a circuit panel such as a printed circuit board and which connects the contacts of the chip to conductors of the circuit panel.

Each chip package has many electrical connections for carrying signals, power and ground between terminals and the chips therein. The electrical connections can include different kinds of conductors such as horizontal conductors, e.g., traces, beam leads, etc., which extend in a horizontal direction relative to a contact-bearing surface of a chip, vertical conductors such as vias, which extend in a vertical direction relative to the surface of the chip, and wire bonds which extend in both horizontal and vertical directions relative to the surface of the chip.

Additional components may be provided within the package, including antennas and EMI shields. EMI shields can be implemented to assist with shielding of electromagnetic interference that may be transmitted through the air. Antennas can be used to receive or transmit signals. Such EMI shields and antennas are commonly plated onto surfaces of the microelectronic assembly.

In many conventional designs, the chip package occupies an area of the circuit panel considerably larger than the area of the chip itself. In some designs which are referred to as "flip chip" designs, the front face of the chip confronts the face of a package substrate, and the contacts on the chip are bonded directly to contacts of the package substrate by solder balls or other connecting elements. In turn, the package substrate can be bonded to a circuit panel through terminals overlying the front face of the chip.

In light of the foregoing, certain improvements can be made in the structure of microelectronic packages and assemblies which comprise a microelectronic package. In this regard, there remains a need for improved packages that are reliable, thin, testable and economical to manufacture.

BRIEF SUMMARY OF THE EMBODIMENTS

According to a first aspect to the disclosure, a method of manufacturing a microelectronic package with an integrally formed electromagnetic interference ("EMI") shield structure is disclosed. The method comprises patterning a conductive structure to comprise a base, a plurality of interconnection elements extending continuously away from the base, and a recessed or die attach area sized to receive a microelectronic element, wherein some of the plurality of interconnection elements are EMI shield interconnection elements that extend around a perimeter of the recessed or die attach area; bonding ends of the plurality of interconnection elements and the EMI shield interconnection elements to a carrier so that a microelectronic element disposed on the carrier is positioned within the recessed or die attach area and so that the EMI shield interconnection elements are laterally adjacent and extend around the microelectronic element, wherein the patterning further comprises patterning the plurality of EMI shield interconnection elements so that the EMI shield interconnection elements are spaced around the microelectronic element to form a first portion of the EMI shield structure; encapsulating the plurality of interconnection elements, the EMI shield interconnection elements, and the microelectronic element with an encapsulant and so that the an outer surface of the conductive structure remains exposed; removing the carrier to expose free ends of the plurality of interconnection elements and the EMI shield interconnection elements; and patterning the exposed outer surface of the conductive structure overlying the microelectronic element to form a second portion of the EMI shield structure, and so that the second portion of the EMI shield structure extends continuously away from and is integrally formed with the first portion of the EMI shield structure.

According to a second aspect of the disclosure, a microelectronic assembly comprises a microelectronic element, a plurality of back side conductive components, and an encapsulant. The microelectronic element may have an active front surface, an opposed rear surface, and opposed edge surfaces extending between the front and rear surfaces. At least some of the plurality of back side conductive components are EMI shield back side conductive components, which further comprise EMI shield interconnection elements and at least one EMI shield back side routing line. The EMI shield back side conductive components form an EMI shield structure around the microelectronic element. An encapsulant surrounds at least the opposed edge surfaces of the microelectronic element and the EMI shield interconnection elements. The EMI shield interconnection elements are configured to form a first portion of the EMI shield structure, wherein the at least one EMI shield back side routing line overlies the rear surface of the microelectronic element and forms a second portion of the EMI shield structure. The at least one back side routing line extends continuously from the EMI shield interconnection elements and along a surface of the encapsulant.

According to a third aspect of the disclosure, a system comprises the assembly according to the second aspect, and one or more other electronic components electrically connected to the assembly.

According to a fourth aspect of the disclosure, a method of manufacturing a microelectronic package with an integrally formed antenna, comprises patterning a conductive structure to form a base, a plurality of interconnection elements extending continuously away from the base, and a recessed or die attach area sized to receive a microelectronic element; bonding ends of the plurality of interconnection elements to a carrier so that a microelectronic element disposed on the carrier is positioned within the recessed or die attach area; encapsulating the plurality of interconnection elements and the microelectronic element with an encapsulant and so that an outer surface of the conductive structure remains exposed; removing the carrier to expose free ends of the plurality of interconnection elements; and patterning the exposed outer surface of the conductive structure to expose a surface of the encapsulant and to include a plurality of conductive back side routing lines extending continuously from and integrally formed with the plurality of interconnection elements, the plurality of conductive back side routing lines extending across the surface of the encapsulant. A first back side conductive routing line of the plurality of conductive back side routing lines is patterned into an antenna routing line to form an antenna. A second back side conductive routing line of the plurality of conductive back side routing lines is patterned into a trace that can carry one of a signal, ground, or power.

A fifth aspect of the disclosure is directed to a microelectronic assembly that comprises a microelectronic element, a plurality of back side conductive components, and an encapsulant. The microelectronic element comprises an active front surface, an opposed rear surface, and opposed edge surfaces extending between the front and rear surfaces. Each of the plurality of back side conductive components comprising an interconnection element and a back side routing line integrally formed with and connected to the interconnection element. The encapsulant surrounds the microelectronic element and edges of the plurality of back side conductive components. A first back side routing line of a first back side conductive component comprises an antenna pattern. A second back side routing line of a second back side conductive component comprises a trace that provides a conductive connection for one of a power, a ground, or a signal.

BRIEF DESCRIPTION OF THE DRAWINGS

The accompanying drawings show exemplary embodiments in accordance with one or more aspects of exemplary assemblies and methods. However, these drawings should not be considered as limiting the scope of the claims, but provide examples that are for explanation and understanding only.

DETAILED DESCRIPTION

According to aspects of the disclosure, a microelectronic assembly can include a plurality of back side conductive components, some of which are arranged to form at least part of an electromagnetic interference ("EMI") shield structure. The EMI shield structure may extend around or adjacent to one or more surfaces of a microelectronic element, such as an active or passive semiconductor device. The EMI shield structure can contain electromagnetic waves generated by the microelectronic element within the EMI shield structure so as to shield other components within the assembly from the electromagnetic waves. This also shields the microelectronic element within the EMI shield structure from electromagnetic waves generated by other components within the assembly. The back side conductive components forming the EMI shield may be further comprised of a back side routing layer that overlies a microelectronic element and that is integrally connected to at least one interconnection element. Formation of the EMI shield structure with integrally formed EMI back side conductive components according to aspects of the disclosure can simplify the manufacturing process, as well as improve package warpage, small form factor, and various other improvements, all of which help to reduce the overall cost of the assembly.

The back side conductive components can additionally or alternatively be arranged on the microelectronic assembly to form one or more antennas. For example, a back side routing layer can be patterned to extend across a rear surface of the encapsulant to form an antenna. In some examples, the antenna can be patterned to overlie at least a portion of a microelectronic element.

Figure 1:
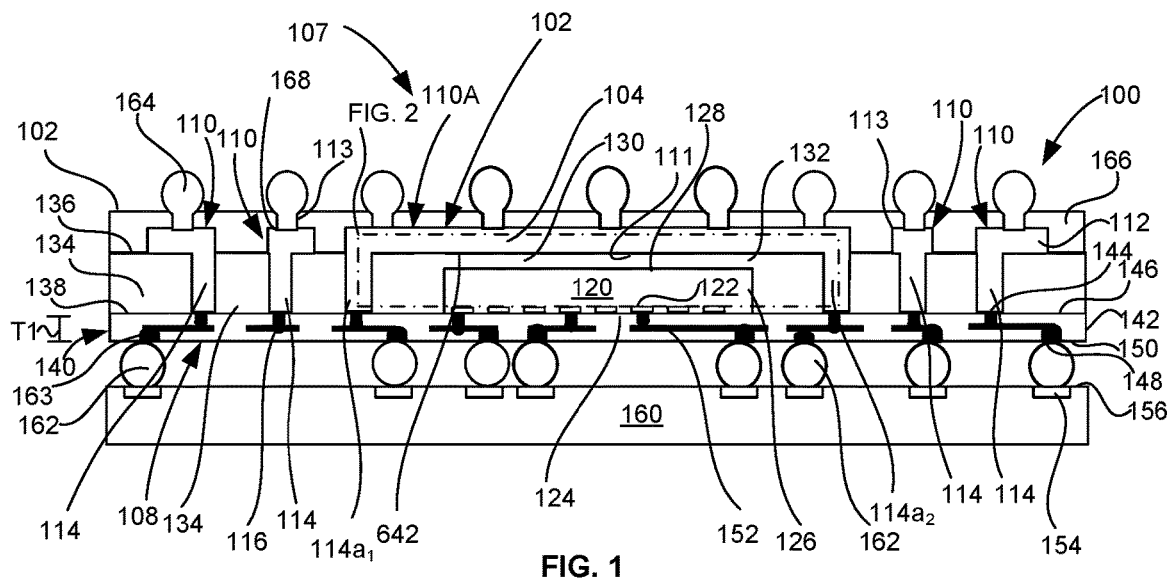
FIG. 1 is a schematic cross-sectional view of an example microelectronic assembly in accordance with aspects of the disclosure.
Figure 2:
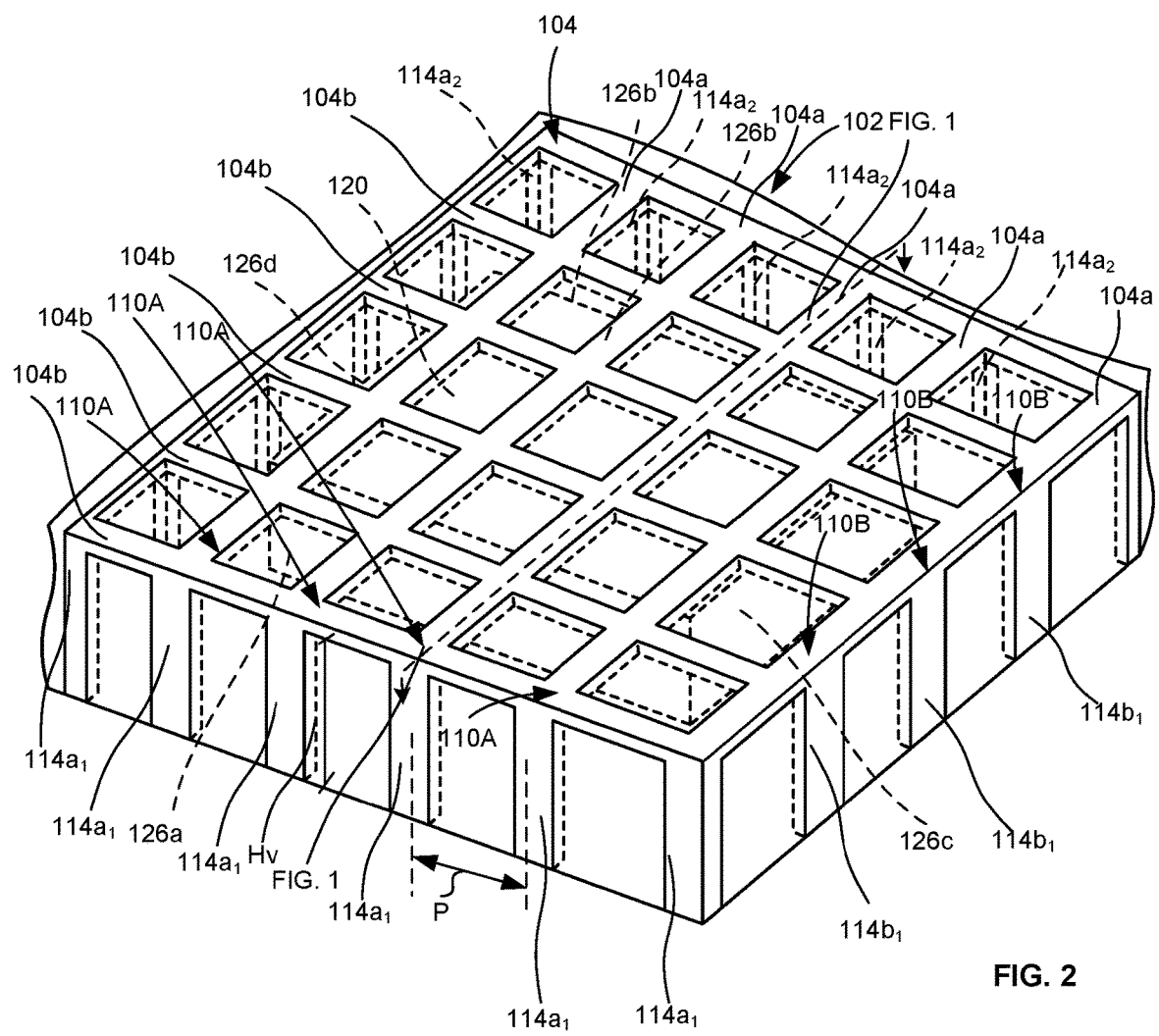
FIG. 2 is a schematic perspective cross-sectional view of an example portion of the microelectronic assembly of FIG. 1.

FIGS. 1-2 illustrate one example microelectronic assembly 100 having a plurality of back side conductive components in which some of the back side conductive components are arranged to form at least part of an EMI shield structure. FIG. 1 is a cross-sectional view that includes the portion taken across the "FIG. 1" line identified in FIG. 2. FIG. 2 is a schematic perspective view of a portion of the microelectronic assembly within the area of the microelectronic assembly identified in FIG. 1. FIG. 2 particularly illustrates a perspective cross-sectional view of an example EMI shield structure 102 that encompasses a microelectronic element 120. As shown in FIG. 2, a first set of example back side conductive components 110A, 110B are arranged to overlie the microelectronic element and form at least part of the EMI shield structure 102. Another set of example back side conductive components 110 are shown in FIG. 1 and positioned outside of or adjacent the EMI shield structure. The plurality of back side conductive components 110, 110A, 110B will be discussed in further detail herein.

The microelectronic assembly 100 may further include an encapsulated microelectronic element 120 having an active front surface 124 and an opposed rear surface 128, as well as an optional redistribution structure 140 having a front surface 146 and a rear surface 150 opposite from the front surface 146. Each of the back side conductive components 110, 110A, 110B in the microelectronic assembly 100 may be simultaneously formed from an integral or continuous unitary structure (FIGS. 11A-11C) that is at least partially pre-processed prior to encapsulation within the assembly 100.

Referring first to the back side conductive components 110 that do not form part of the EMI shield structure, the back side conductive components 110 may be formed from at least one interconnection element that is integrally formed with at least one back side routing layer or line. For example, each of the back side conductive components 110 are shown to include an interconnection element 114 and a back side routing line 112 that extend along an axis parallel to the front and rear surfaces 124, 128 of the microelectronic element 120. The interconnection elements 114 can extend away from and in a direction vertical to the back side routing layers 112.

Back side conductive components 110A, 110B may be constructed and arranged to form an EMI shield structure. An example arrangement of back side conductive components is shown in FIG. 2, which collectively create EMI shield structure 102. EMI shield structure may be similar to an EMI shield or Faraday cage, but other types of EMI shield structures, including those that do not completely surround a microelectronic element or device, are contemplated within the scope of the disclosure. To facilitate discussion, the back side conductive components forming the EMI shield structure 102 will also be further referred to as EMI shield back side conductive components 110A, 110B. The EMI shield back side conductive components 110A, 110B will be similarly formed from an integrally-formed EMI shield back side routing layer 104 (which further includes routing lines) and one or more interconnection elements 114 that are arranged to extend around microelectronic element 120 to contain electromagnetic waves generated by microelectronic element 120, as well as protect microelectronic element 120 from electromagnetic waves generated outside of the EMI shield structure.

With reference to both FIGS. 1-2, the EMI shield back side conductive component 110A can include, for example, one back side routing line 104a that is connected to a first interconnection element 114a$_1$ at one end and a second interconnection element 114a$_2$ at an opposed end. With reference to FIG. 2, the EMI shield back side conductive component 110B can similarly include one back side routing line 104b that is integrally connected to a first interconnection element 114b$_1$ at one end and a second interconnection element 114b$_2$ at an opposed end. In other examples, one or more of the EMI shield back side routing lines 104a, 104b need only be joined to one interconnection element. As will be discussed, the arrangement of the EMI shield back side conductive components 110A, 110B relative to one another can form the EMI shield structure.

Figure 11A:
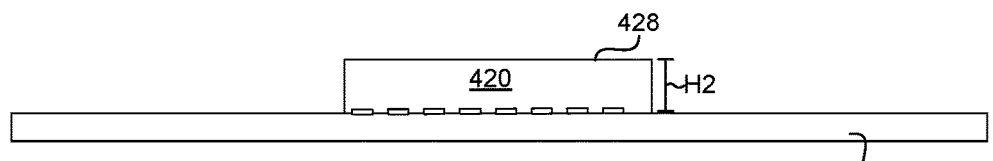
FIGS. 11A-11K are schematic cross-sectional and top views showing an example method of making the microelectronic assembly of FIG. 1 in accordance with aspects of the disclosure.
Figure 11B:
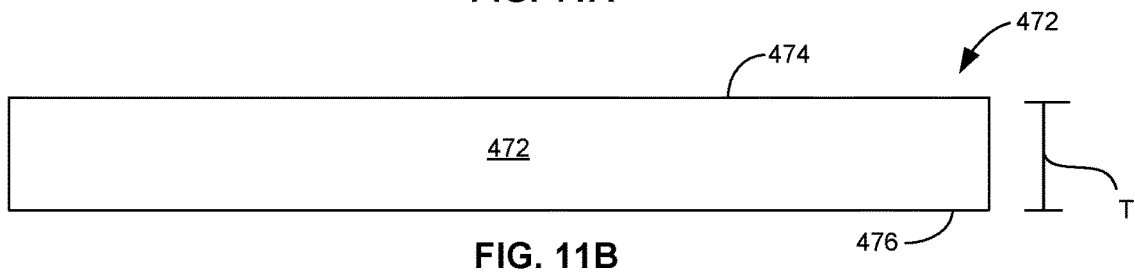
Figure 11C:
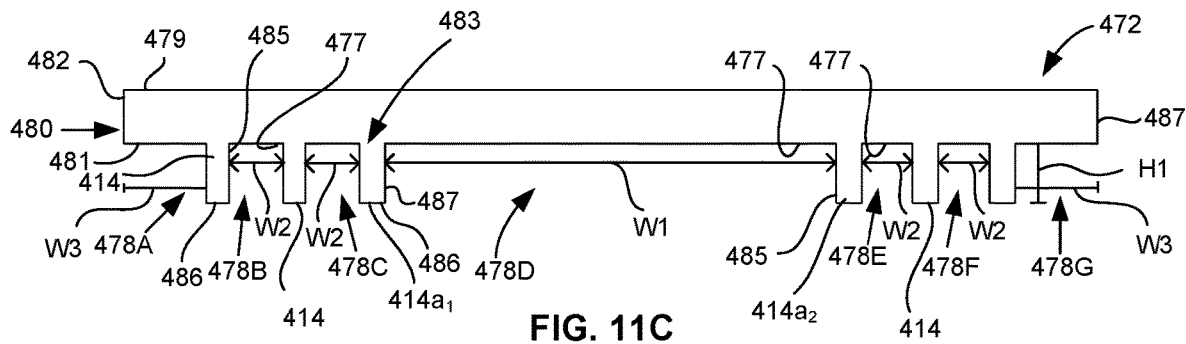

The back side conductive components, including back side conductive components 110 and EMI shield back side conductive components 110A, 110B, can be concurrently formed at the same time and from the same conductive structure as will be further discussed in FIGS. 11A-11C. The EMI shield back side conductive components 110A, 110B (FIG. 2) that form the EMI shield structure and the remaining back side conductive components 110 that do not form the EMI shield structure are otherwise similar. The back side conductive components 110, 110A, 110B can further provide interconnections between the microelectronic element 120 and other components within the assembly 100 or external to the assembly 100.

With the back side conductive components 110, 110A, 110B being formed at the same time, the back side conductive components 110, 110A, 110B may be formed from materials that are conductive and can carry a grounded shield. In some examples, ferromagnetic materials and/or ferromagnetic alloys may be used, such as iron, cobalt, and/or nickel. In other examples, other materials may be used, including copper, aluminum, solder, tungsten, cobalt, palladium, gold, silver, and/or their respective alloys.

The EMI shield structure can be positioned adjacent at least one surface of microelectronic element 120. In this example, EMI shield structure 102 extends around the periphery of the microelectronic 120. As shown, EMI shield structure 102 may be formed from a plurality of EMI shield back side conductive components 110A, 110B, with EMI shield back side conductive components 110A being positioned perpendicular to EMI shield back side conductive components 110B. In one example, the EMI shield structure 102 can extend along a plane parallel to and overlie the rear surface 128 of microelectronic element 120. EMI shield structure 102 can further extends around a first set of opposed lateral edge surfaces 126a, 126b and a second set of opposed lateral edge surfaces 126c, 126d that extend between the rear surface 123 and opposed front surface 124 of the microelectronic element 120.

A plurality of EMI shield interconnection elements 114a form a first portion of EMI shield structure 102 and can extend around the lateral edge surfaces 126a, 126b, 126c, 126d of the microelectronic element 120. The vertical height Hv (FIG. 2) of the plurality of interconnection elements may extend from at least the front surface 124 to the rear surface 128 of the microelectronic element 120. This arrangement of EMI shield interconnection elements 114a provides EMI shielding around the lateral edge surfaces 126a, 126b, 126c, 126d. According to one example, the interconnection elements 114 only extend in a vertical direction such that there are no conductive connections that extend laterally between and interconnect two adjacent interconnection elements 114a$_1$ and/or 114a$_2$. In other examples, additional lateral interconnection may exist between two adjacent interconnection elements 114a$_1$ and/or 114a$_2$.

The EMI shield interconnection elements 114a$_1$ may be laterally spaced apart from one another a pre-determined width or pitch to create EMI shielding around the microelectronic element 120, and particularly lateral EMI shielding around the peripheral edges 126a, 126b, 126c, 126d of the microelectronic element 120. Depending on the level of shielding desired, the EMI shield interconnection elements 114a$_1$ may be spaced closer together or further apart. For example, as shown in FIG. 2, a center-to-center pitch P between two directly adjacent EMI shield interconnection elements 114a$_1$, in an array may range from 100 µm to 1 mm. But, in other examples, the pitch may be less than 100 µm or greater than 1 mm. In one example, the pitch may be 300 µm. In still other examples, the pitch may be at least 300 µm. The pitch between two adjacent EMI shield interconnection elements 114a$_1$ may be the same for some or all EMI shield interconnection elements 114a$_1$ or can differ throughout. The interconnection elements 114a$_2$, 114b$_1$, 114b$_2$ may have similar pitches.

EMI shield back side routing layer 104 may form a second portion of the EMI shield structure 102. EMI shield back side routing layer 104 can overlie the rear surface 128 of the microelectronic element 120 and extend along an axis parallel to the front and rear surfaces of the microelectronic element 120. In one example, EMI shield back side routing layer 104 overlies the top surface 136 of the encapsulant 134, as well as the rear surface 128 of the microelectronic element 120. As shown, the back side routing layer 104 may be formed in a grid or mesh-like pattern, such that the EMI shield back side routing layer 104 includes routing lines that extend in directions parallel and perpendicular to one another. As shown, horizontal back side routing lines 104a extend continuously from a first EMI shield interconnection element $114a_1$ adjacent lateral edge 126a, across rear surface 128 of microelectronic element 120, and to a second interconnection element $114a_2$ adjacent lateral edge 126b. In this example, the horizontal back side routing lines 104a extend beyond lateral edges 126a, 126b of microelectronic element 120. Perpendicular back side routing lines 104b extend in a direction perpendicular to the horizontal back side routing lines 104a, such that the back side routing lines 104b intersect with the horizontal back side routing lines 104a. As shown, the perpendicular back side routing lines 104b extend continuously from EMI shield interconnection elements $114b_1$ adjacent lateral edge 126c, across rear surface 128 of microelectronic element 120, and to EMI shield interconnection elements $114b_2$ that are adjacent lateral edge 126d. In this example, the perpendicular back side routing lines 104b also extend beyond lateral edges 126c, 126d of microelectronic element 120.

A manufacturing process that incorporates back side conductive components 110, including EMI shield back side conductive components 110A, 110B integrally formed at the same time from a pre-processed unitary structure, as opposed to being formed by plating conductive vias or the like, allows for improvements over known assemblies, including a reduction in the overall cost of the assembly, simplified fabrication, improvements on package warpage, small form factor, and various other improvements.

The microelectronic element 120 can be a semiconductor chip having a plurality of bond pads 122 at its front surface 124. Each microelectronic element 120 also includes a rear surface 128 opposite from its front surface 124. Edge surfaces 126a, 126b, 126c, 126d of the microelectronic element may extend away from the front surface 124 of the microelectronic element 120 and between the front surface 124 and rear surface 128.

In one example, the microelectronic element 120 may be a semiconductor chip having one or more memory storage arrays, which may include a particular memory type such as nonvolatile memory. Nonvolatile memory can be implemented in a variety of technologies some of which include memory cells that incorporate floating gates, such as, for example, flash memory, and others which include memory cells which operate based on magnetic polarities. Flash memory chips are currently in widespread use as solid state storage as an alternative to magnetic fixed disk drives for computing and mobile devices. Flash memory chips are also commonly used in portable and readily interchangeable memory drives and cards, such as Universal Serial Bus (USB) memory drives, and memory cards such as Secure Digital or SD cards, microSD cards (trademarks or registered trademarks of SD-3C), compact flash or CF card and the like. Flash memory chips typically have NAND or NOR flash type devices therein; NAND type devices are more common. Other examples of semiconductor chips are one or more DRAM, NOR, microprocessor, controller die, etc. or combinations thereof. Each semiconductor chip may be implemented in one of various semiconductor materials such as silicon, germanium, and gallium arsenide or one or more other Group III-V semiconductor compounds or Group II-VI semiconductor compounds, etc.

The EMI shield structure 102 in this example is shown extending around and adjacent to all surfaces of the microelectronic element 120, except for the front surface 124 of the microelectronic 120. In other examples, the EMI shield structure 102 may extend adjacent only one surface, or may extend adjacent to more than one surface, such as two, three, four, five, or six surfaces. For example, the EMI shield structure may only extend adjacent one of the edge surfaces 126a, 126b, 126c, 126d of the microelectronic element 120 that extend between the rear surface 128 and front surface 124 of the microelectronic element 120. In such example, only the interconnection components, such as interconnection elements $114a_1$, $114a_2$ would extend directly adjacent one of the edge surfaces of the microelectronic element 120 and no back side routing layer would be patterned to overlie the microelectronic element. In another example, an EMI shield structure 102 may instead only overlie the rear surface 128 of the microelectronic element 120, such that only the back side routing layer overlies at least a portion of the rear surface 128 of the microelectronic element 120 and the interconnection elements $114a_1$, $114a_2$ are not positioned directly adjacent the edge surfaces 126a, 126b, 126c, 126d of the microelectronic element 120.

Although only one microelectronic element 120 is illustrated in this configuration, in other examples, one or more microelectronic elements 120 may be contained within the EMI shield structure 102. In still other examples, one or more passive components may be additionally or alternatively provided within the EMI shield structure 102. For example, the microelectronic element 120 can be a passive device or in another example, the microelectronic element 120 may be an active device and an additional passive device may be positioned within the EMI shield structure 102. Multiple EMI shield structures 102 can also be positioned within the overall microelectronic assembly 100, some or all of which contain one or more multiple microelectronic elements 120 within the EMI shield structure 102.

The microelectronic element 120 and each of the interconnection elements 114 of the back side conductive components 110, 110A, 110B may be encapsulated within an encapsulant 134. The back side routing layer 112 of the back side conductive components 110 that do not form part of the EMI shield structure 102, as well as the EMI shield back side routing layer 104 can overlie the top surface 136 of the encapsulant 134. In this example, EMI shield back side routing layer 104 of the EMI shield back side conductive components 110A, 110B, and the other back side routing layer 112 of the other back side conductive components 110 can further extend along the top surface 136 of the encapsulant 134. Ends 116 of the interconnection elements 114 can be positioned adjacent the bottom surface 138 of the encapsulant 134.

In particular embodiments, the material forming the encapsulant 134 can be an epoxy-based polymer system with fillers, overmold, or potting compound. Such compound can provide stiffness to the overall assembly 100 to withstand internal differential thermal expansion between the assembly 100 and other components within the assembly. The compound may in some cases provide protection from shorting and moisture and/or water resistance. Such material can further help to provide a relatively rigid encapsulation which supports planarity of the overall assembly 100. The material of the encapsulant 134 may typically include a composition different from the composition of the dielectric layers of the redistribution structure 140.

As shown in FIG. 1, microelectronic assembly 100 may further include an optional redistribution structure 140, which can also be referred to as a "circuit structure" made of a plurality of dielectric layers and electrically conductive features thereon, as described generally in U.S. Provisional Application No. 62/159,136, the disclosure of which is incorporated by reference herein. The electrically conductive features may comprise a plurality of bumps and/or or pads at a first surface of the circuit structure and a plurality of circuit structure contacts at a second surface opposite the first surface. The circuit structure may further include a plurality of traces, wherein the bumps and/or pads and the circuit structure contacts are electrically coupled by the traces.

In one example, the redistribution structure 140 can comprise or can be made from a plurality of thin dielectric layers 142 stacked one atop another, and front contacts 144 at the front surface 146, rear contacts or terminals 148 at the rear surface 150, and conductive traces 152 electrically coupling the front contacts 144 with the terminals or rear contact 148 of the assembly 100. In one example, the redistribution structure 140 can have a maximum thickness T1 of less than 10 microns in a direction normal to the front surface 146 of the redistribution structure 140. In a particular example, the redistribution structure 140 can have a maximum thickness T1 of less than 30 microns in a direction normal to the front surface 146 of the redistribution structure 140, but in other example, the thickness T1 can be greater than 30 microns.

The dielectric material of the dielectric layers 142 can be a material that can be deposited and patterned to form structures that support metallization thereon at a pitch of less than 5 microns, less than 2 microns, less than 1 micron, or at least as low as 0.2 microns. In one embodiment, each of the dielectric layers 142 can be planarized before depositing the next dielectric layer. In particular examples, the dielectric material can be deposited by chemical vapor deposition ("CVD"), spray coating, spin coating, roller coating, dipping, or the like.

The dielectric layers 142 may be made from various dielectric materials, such as, for example polymer base or a polyimide. In other examples, the dielectric layers may be composed of alternative dielectric materials, such as silicon dioxide and silicon nitride. In particular examples, the dielectric material can be a photosensitive polymer, e.g., benzocyclobutene ("BCB") based material, or other photosensitive material. In particular examples, the dielectric material can be deposited by chemical vapor deposition ("CVD"), spray coating, spin coating, roller coating, slot die coating, dipping, or the like. In particular examples, a self-planarizing dielectric material can be deposited to form one or more of the dielectric layers, such material having a tendency to form a flattened or flat upper surface as compared to topography that may be present in features underlying the upper surface.

The electrically conductive features of the redistribution structure 140 can provide electrical interconnection between the microelectronic element 120 and components external to the assembly 100. The electrically conductive features of the redistribution structure 140 can also provide chip-to-chip electrical interconnectivity among other microelectronic elements (not shown) that may be present in the assembly 100. The front contacts 144 of the redistribution structure 140 can be configured for flip-chip or redistribution layer connection with a plurality of bond pads 122 at the front surface 124 of the microelectronic element 120 and overlie different portions of an area of the front surface 146 of the redistribution structure 140. Stated another way, the front contacts 144 can be configured to be joined with the corresponding bond pads 122, in a state in which the front contacts 144 of the redistribution structure are juxtaposed with, i.e., face the corresponding bond pads 122 of the microelectronic element 120.

The electrically conductive features including the bumps 162, pads 163, front contacts 144, rear contacts 148, and the conductive traces 152 can be made of an electrically conductive material, for example, a metal such as copper, aluminum, nickel, gold, or the like. In one example, the bumps 162 can comprise an electrically conductive bond material such as solder, tin, indium, copper, gold, a eutectic composition or combination thereof, another joining material such as a conductive paste or a conductive adhesive, and/or an electrically conductive composition that includes a metal component such as metal particles or flakes and a polymeric component. Such bumps can be deposited onto the front contacts or pads 163.

In a particular embodiment, the conductive bond material of the bumps 162 can include an electrically conductive matrix material such as described in U.S. patent application Ser. Nos. 13/155,719 and 13/158,797, the disclosures of which are hereby incorporated herein by reference. In a particular embodiment, the conductive bond material of the bumps 162 can have a similar structure or be formed in a manner as described therein. In some examples, suitable materials for the conductive bond material of the bumps 162 can include polymers filled with conductive material in particle form such as metal-filled polymers, including, for example, metal-filled epoxy, metal-filled thermosetting polymers, metal-filled thermoplastic polymers, or electrically conductive inks.

In other examples, the bumps 162 can comprise posts or pins, stud bumps or bond via interconnects each formed of extruded wire, such bumps projecting to heights thereof from the second side 108 of the assembly 100, and can be joined with components external to the microelectronic assembly 100, such as circuit panel or board. Alternatively, pads 163 can be configured to accept pins (not shown) from a socket (not shown).

Additional interconnection elements may be further provided on the back side of the microelectronic assembly 100. In one example, bumps 164 may also be provided on opposed portion of the assembly 100 overlying the top surface 136 of the encapsulant 134 and provide an electrical interconnection to a component external to the back side of the microelectronic assembly 100. As shown, a dielectric layer, for example, solder mask 166, may overlie the first side 107 of the back side conductive component 110. Openings 168 in the solder mask 166 expose at least a portion of the outer surfaces 113 of the routing layer 112 so as to provide conductive contacts. The bumps 164 may be disposed at the conductive contacts exposed portions of the outer surfaces 113 of the back side routing layers 112 to provide an external connection. The bumps 164 can also be electrically connected to the bumps 162 at the second side 108 of the microelectronic assembly 100 through the back side conductive component 110, including the back side routing layer 112 and interconnection elements 114, as well as the redistribution structure 140.

The first side 107 and second side 108 of the assembly 100 can be joined to and electrically interconnected with a component external to the assembly 100. For example, the rear contacts 148 of the assembly 100 are shown electrically coupled to panel contacts 154 at a major surface 156 of an external device 160, such as circuit panel or board, by conductive bond material 162 confronting the second side 108 of the assembly 100, but the rear contacts 148 can be connected to other components, such as other chip packages and the like. The first and second sides 107,108 of the assembly 100 may also be interconnected to one another through the back side conductive components 110. Additionally, a redistribution structure 140 may be provided for in the microelectronic assembly.

Figure 3:
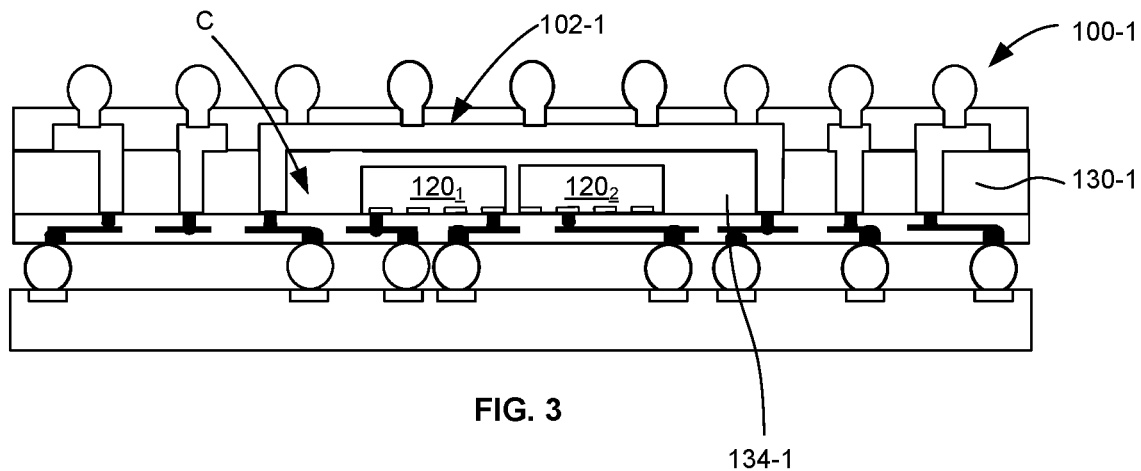
FIG. 3 is a schematic cross-sectional view of an example microelectronic assembly in accordance with another aspect of the disclosure.

Multiple chips and/or other electronic components can be positioned within the EMI structure. FIG. 3 illustrates an alternative microelectronic assembly 100-1 which is otherwise identical to microelectronic assembly 100 and can include the same or similar components, except that more than one microelectronic element is disposed within the EMI shield structure 102-1. In this and other embodiments described herein, similar reference numerals will be used to identify similar elements. As shown in this example, two microelectronic elements, a first microelectronic element 1201 and a second microelectronic element 1202, are positioned within a central portion C of the EMI shield structure 102-1. In this example, the EMI shield structure 102-1 can overlie at least two microelectronic elements 1201, 1202, as well as encapsulant 134-1.

Figure 3A:
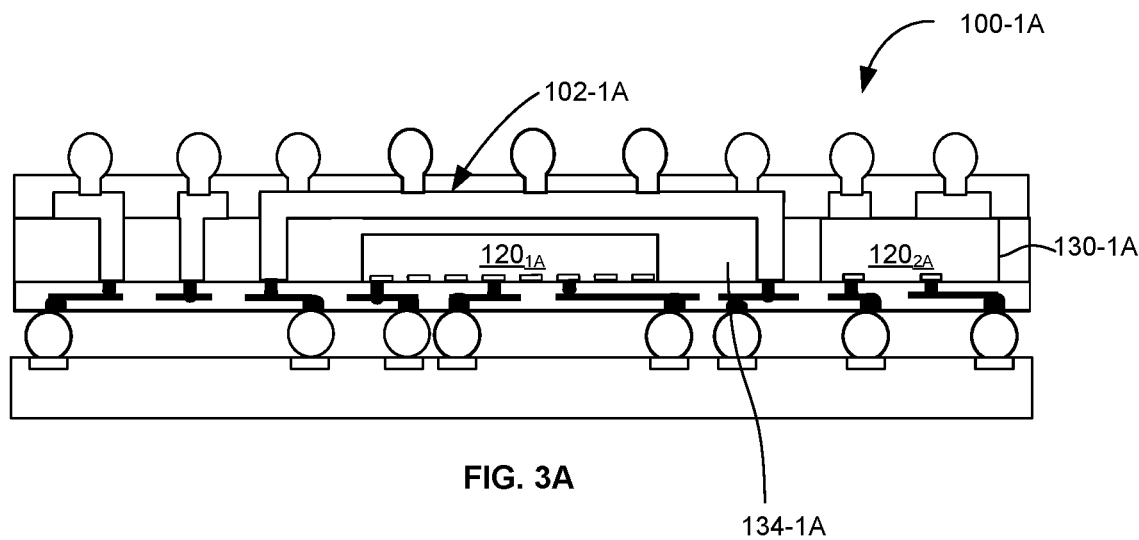
FIG. 3A is a schematic cross-sectional view of an example microelectronic assembly in accordance with another aspect of the disclosure.

Intra-package shielding may be accomplished according to aspects of the disclosure. As shown in FIG. 3A, microelectronic assembly 100-1A is otherwise similar to microelectronic assembly 100 of FIGS. 1-2 and can include a first microelectronic element 1201A positioned within an EMI shield structure 102-1A, an encapsulant 134-1A, and other similar components. The only difference in this embodiment is that a second microelectronic element 1202A may be positioned exterior to the EMI shield structure 102-1A, and in some examples directly adjacent the EMI shield structure 102-1A. In this arrangement, EMI shield structure 102-1A will shield the first microelectronic element 1201A from the electromagnetic waves of the second microelectronic element 1202A and vice versa. Electromagnetic waves generated by first microelectronic element 1201A will be contained by the EMI shield structure 102-1A, which further shields the second microelectronic element 1202A from any electromagnetic waves generated by the first microelectronic element 1201A. In another example, a second EMI shield structure (not shown) may be positioned adjacent at least one surface of the second microelectronic element 1202A, such that multiple EMI shield structures may be present within the assembly 100-1A.

Figure 4:
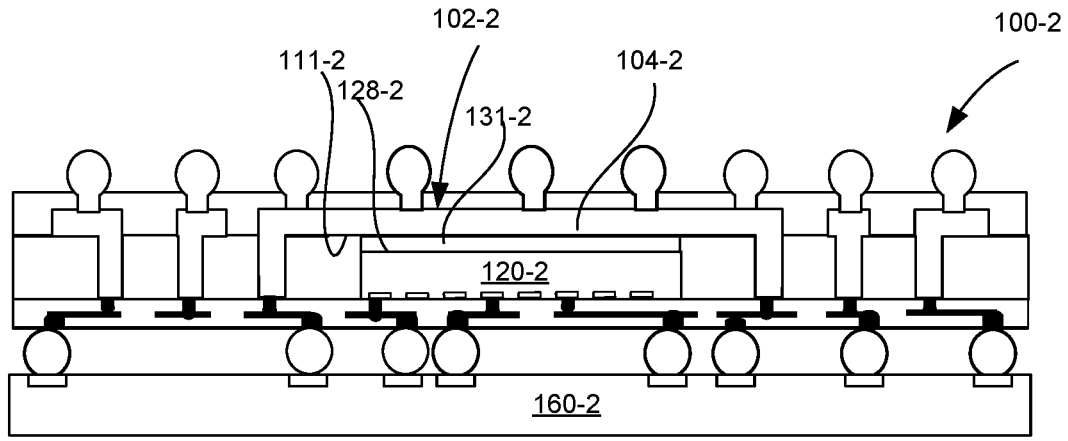
FIG. 4 is a schematic cross-sectional view of an example microelectronic assembly in accordance with another aspect of the disclosure.

The microelectronic assembly 100 of FIGS. 1-2 can optionally include a material capable of conducting heat away from the microelectronic element. In one example, as shown in FIG. 4, a microelectronic assembly 100-2 is otherwise identical to microelectronic assembly 100 (FIG. 1), except that it further includes a heat dissipation material. In one example, the material is a thermal interface material ("TIM") 131-2 that overlies the rear surface 128-2 of the microelectronic element 120-2 and is positioned between the EMI shield structure 102-2 and the microelectronic element 120-2. In some examples, the thermal interface material 131-2 can also be used to bond the bottom surface 111-2 of the EMI shield structure 102-1 to the microelectronic element 120-2. Exemplary TIMs are those that exist in semi-solid, gel-like (grease-like) state throughout the range of expected operating temperatures (e.g., 0 degrees Celsius to 200 degrees Celsius for some assemblies) or at least when the temperatures are high to make die cooling particularly desirable (20 degrees Celsius to 200 degrees Celsius for some assemblies). The thermal interface material 131-2 can fill the free space between microelectronic element 120-2 and the EMI shield back side routing layer 104-2 of the EMI shield structure 102-1. An exemplary TIM material is a thermal grease available from Arctic Silver, Inc. (having an office in California, USA); the grease's thermal conductivity may be in the range of 1 W/mK, but other grease and/or materials with varying thermal conductivities may be utilized. In still other examples, instead of a thermal interface material 131-2, a structure configured to dissipate heat, such as a heat sink or the like may be utilized and extend around one or more surfaces of the microelectronic element 120-2.

Figure 5:
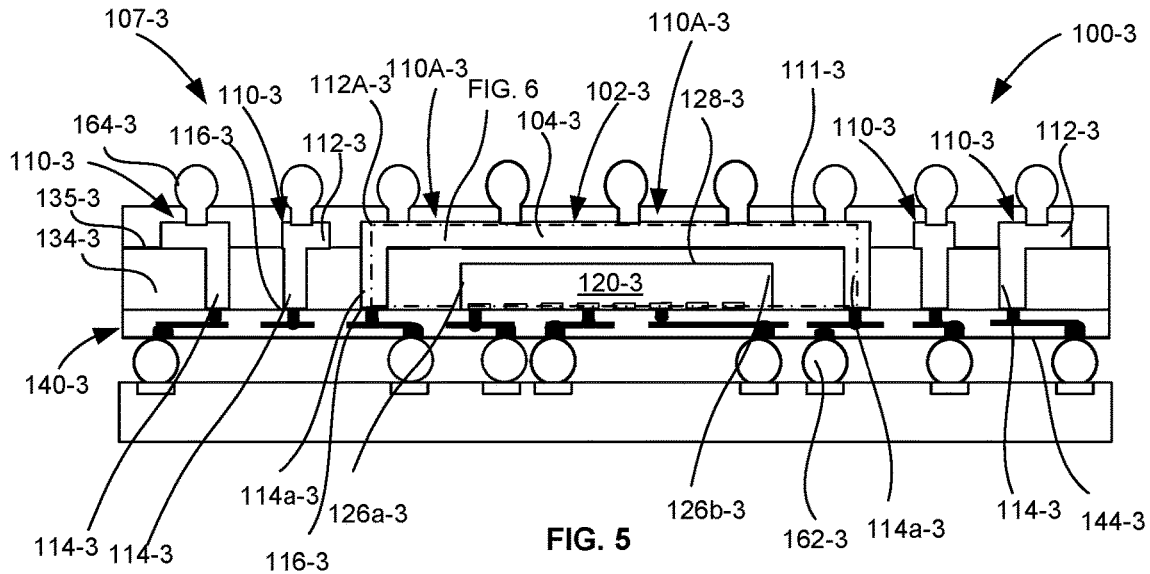
FIG. 5 is a schematic cross-sectional view of another example microelectronic assembly in accordance with another aspect of the disclosure.
Figure 6:
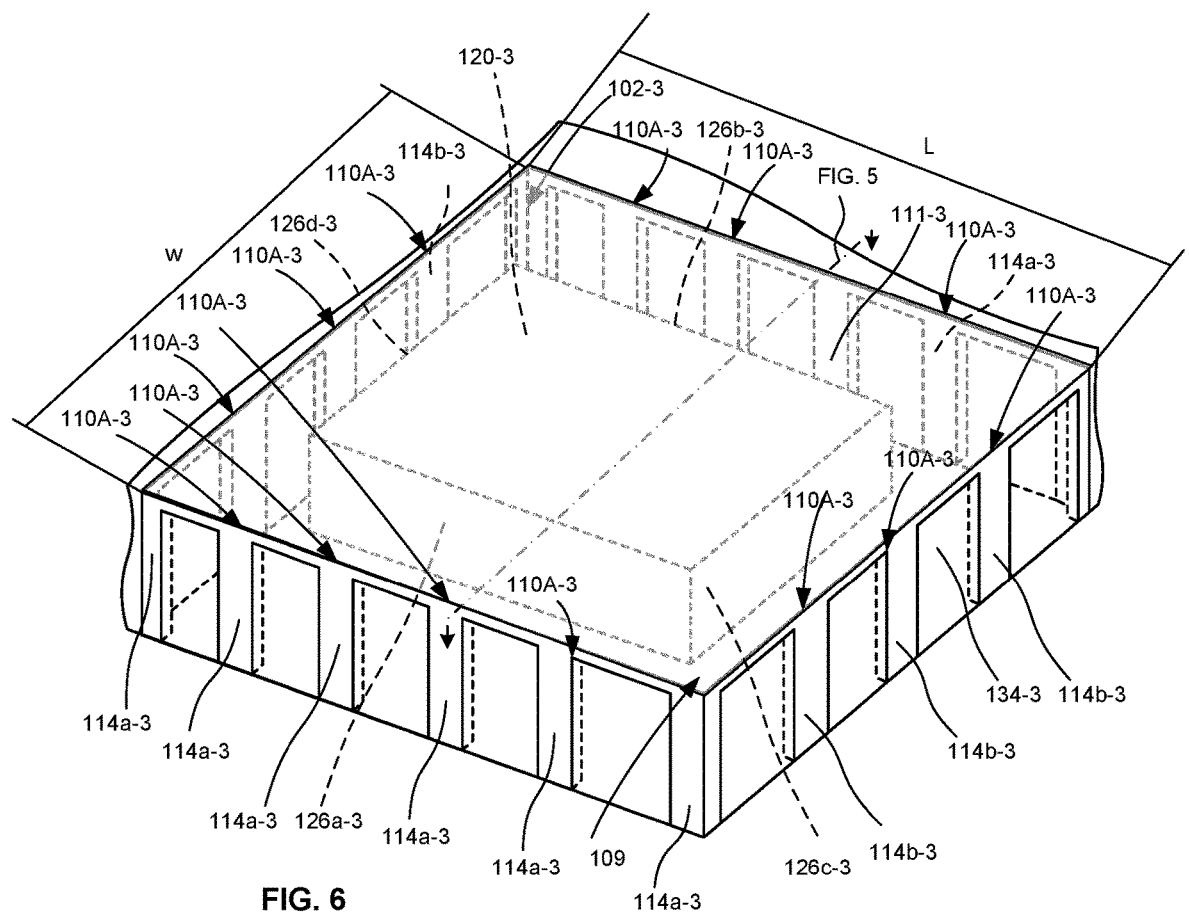
FIG. 6 is a schematic perspective cross-sectional view of an example portion of the microelectronic assembly of FIG. 5.

Another example microelectronic assembly 100-3 is shown in FIGS. 5-6. FIG. 5 is a cross-sectional view of the microelectronic assembly 100-3 that includes the portion taken across the "FIG. 5" line identified in FIG. 6. FIG. 6 illustrates a schematic and perspective cross-sectional view of a portion of the microelectronic assembly encompassed by the area of the microelectronic assembly identified in FIG. 5. In particular, a view shown through the planar top surface of an example EMI shield structure is shown.

The structure of the microelectronic assembly 100-3 is similar to the microelectronic assemblies of FIGS. 1-4, but includes an example EMI shield structure 102-3 with a top or major surface 111-3 that differs in design. As in the previously-described embodiment, microelectronic assembly 100-3 can include a plurality of back side conductive components, which in this example, includes EMI shield back side conductive components 110A-3 and at least one back side conductive component 110 that is outside of or adjacent the EMI shield structure 102-3. As in the previous examples, back side conductive components 110-3 that extend outside of the EMI shield structure 102-3 may include an integrally formed and continuous back side routing line 112-3 and an interconnection element 114-3. In this example, EMI shield back side conductive components 110A-3 may each comprise a plurality of interconnection elements 114a-3 integrally joined to an EMI shield back side routing layer or line 104-3 (FIGS. 5,6) that is a unitary EMI shield back side routing layer line 104-3, as discussed further below.

The EMI shield back side conductive components 110A-3 can be arranged in numerous configurations to provide an EMI shield structure. In one example, as shown in FIG. 6, the back side conductive components 110A-3 can be constructed and arranged to form an EMI shield structure with a continuously planar major surface, such as EMI shield structure 102-3. As shown, EMI shield back side conductive components 110A-3 may be arranged to extend around the entire periphery of the microelectronic element 120-3. The EMI shield interconnection elements 114a-3 of the EMI shield back side conductive components 110A-3 can extend around the peripheral edge surfaces 126a-3, 126b-3, 126c-3, 126d-3 of the microelectronic element 120-3. The EMI shield back side routing layer 104-3, which continuously extends from each of the EMI shield interconnection elements 114a-3, overlies at least a portion of a surface of the microelectronic element 120-3 and in this example overlies the entire rear surface 128-3 of the microelectronic element 120-3. As shown, the back side routing layer 104-3 can extend from all of the EMI shield interconnection elements 114a-3 that together form the EMI shield structure 102-3.

EMI shield back side routing layer 104-3 may be comprised of a monolithic and unitary back side routing layer that extends the entire width W and length L of the EMI shield structure 102-3. As shown, the major surface 111-3 of the EMI shield structure 102-3 may be continuously planar. Since the major surface 111-3 of the EMI shield structure 102-2 is joined to each of the EMI shield interconnection elements 114a-3 forming the EMI shield structure 102-2, the EMI shield back side routing line 104-3 (FIG. 5) of each individual conductive component 110A-3 is part of the monolithic and unitary back side routing layer or line that extends across the entire width W or length L of the EMI shield structure 102-2. In this example, there are no independent back side routing lines or traces that extend from any one of the EMI shield interconnection elements 114a-3 that form the EMI shield structure 102-3.

As shown, encapsulant 134-3 encapsulates the microelectronic element 120-3, the interconnection elements 114-3, and the EMI shield interconnection elements 114A-3 of EMI shield structure 102-3. Exposed ends 116-3 of the interconnection elements 114-3, 114a-3 can be electrically connected with an optional redistribution structure 140-3, and in particular front contacts 144-3 at the surface of the redistribution structure 140-3.

A portion of the EMI shield back side conductive components 110A-3 overlies the encapsulant 134-3, and particularly the continuous back side routing layer 104-3 can overlie either or both the encapsulant 134-3 and the microelectronic element 120-3 at one time.

Figure 7:
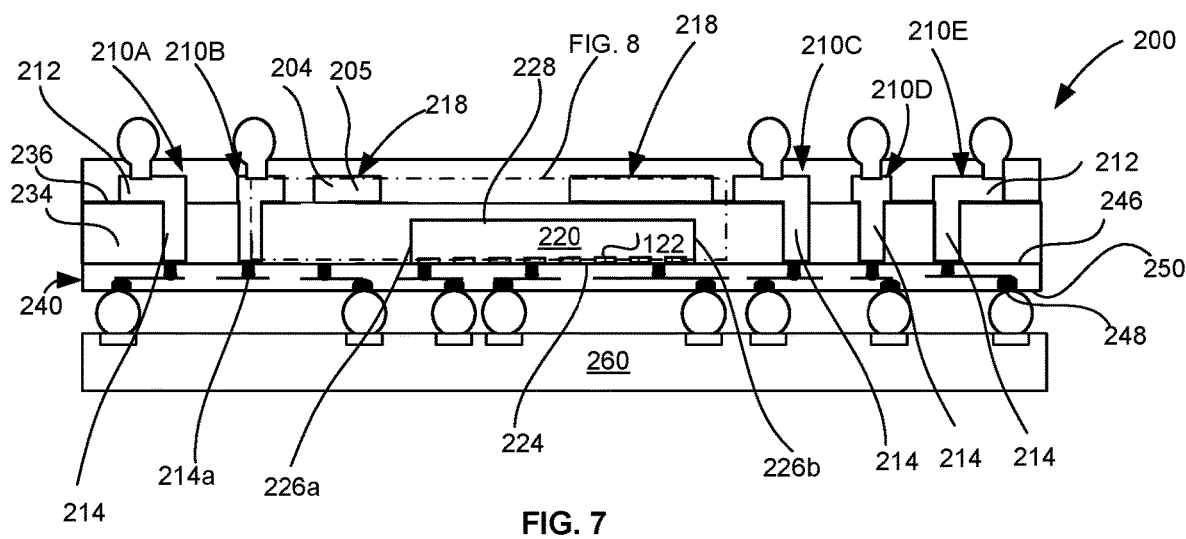
FIG. 7 is a schematic cross-sectional view of an example microelectronic assembly in accordance with another aspect of the disclosure.
Figure 8:
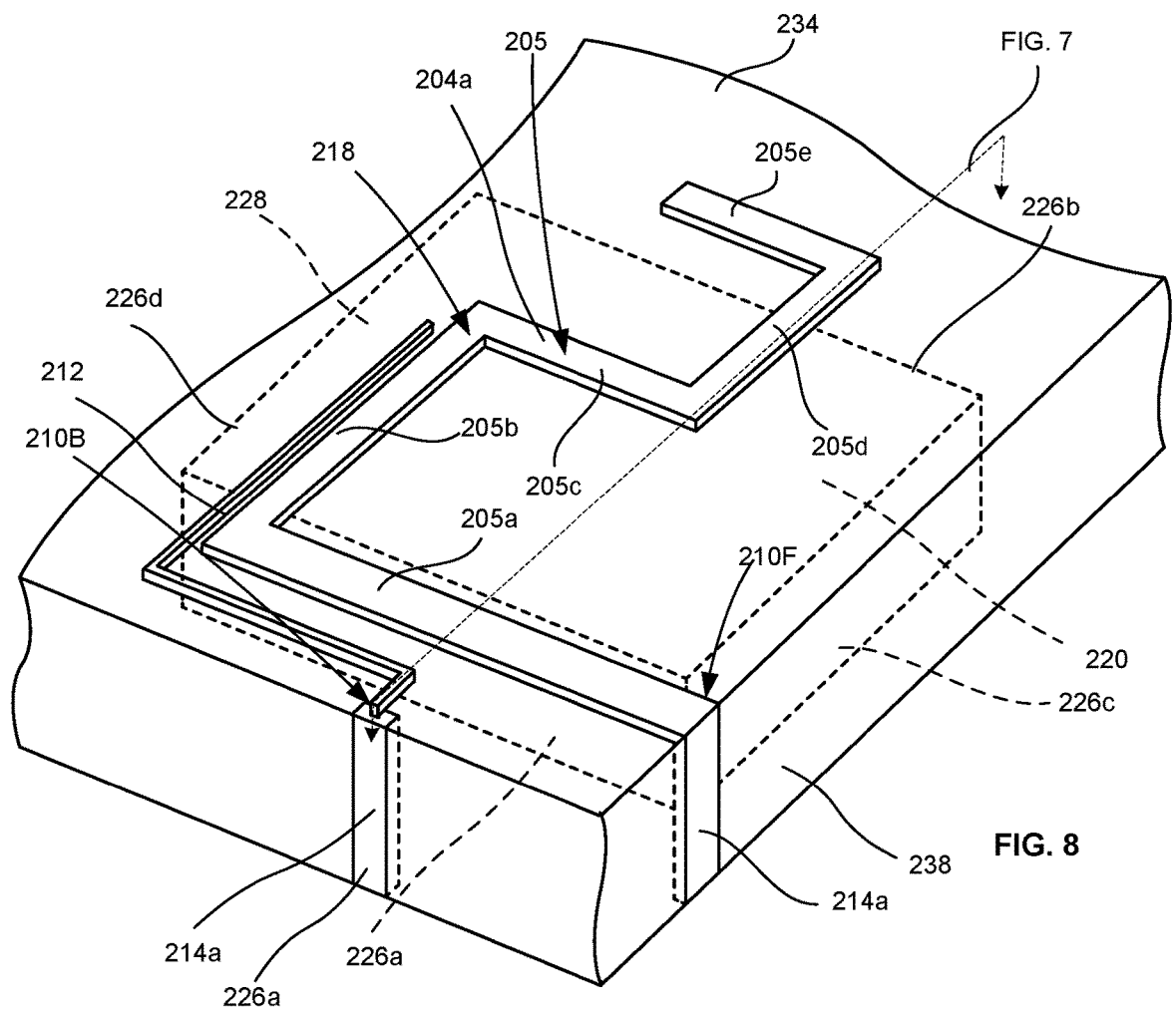
FIG. 8 is a schematic perspective cross-sectional view of an example portion of the microelectronic assembly of FIG. 7.

FIGS. 7-8 illustrate another example microelectronic assembly 200 comprising an antenna formed from one of the back side conductive components. FIG. 7 is a schematic cross-sectional view that includes the portion of the assembly taken across the line "FIG. 7" identified in FIG. 8. FIG. 8 is a schematic and perspective cross-sectional view of a portion of the microelectronic assembly 200 that illustrates antenna 218, and particularly depicts the portion of the microelectronic assembly 200 identified in FIG. 7.

Microelectronic assembly 200 includes a plurality of back side conductive components, including back side conductive components 210A, 210B, 210C, 210D, 210E, 210F (FIG. 8) (collectively back side conductive components of the microelectronic assembly 200). The back side conductive components may be formed from the same integral or continuous unitary structure (e.g., FIGS. 14A-14C) that is at least partially pre-processed prior to encapsulation within the assembly 200. One of the plurality of back side conductive components 210F (FIG. 8) may be patterned to form an antenna, such as antenna 218. The microelectronic assembly may further include a microelectronic element 220 having a front surface 224 and an opposed rear surface 228, as well as an optional redistribution structure 240 having a front surface 246 facing toward the front surface 224 of the microelectronic element 220 and an opposed rear surface 250 facing away from the microelectronic element 220.

The antenna 218 can permit transmission of communication signals over commonly available wireless interfaces. In one example where the package assembly includes an RF semiconductor chip (transceiver), antenna 218 can provide wireless communication and detection. Although only one antenna 218 is illustrated, it is to be appreciated that more than one antenna or an array of antennas may be provided within the assembly 200.

The back side conductive component 210F (FIG. 8) may comprise at least one integrally formed antenna routing line (which will form antenna 218) and at least one interconnection element. In this example, antenna 218 is comprised of one antenna routing line 205 that continuously extends from and is integrally formed with a single interconnection element 214a. As shown, interconnection element 214a may extend in a vertical or upright direction that is parallel to the edge surface 226c of microelectronic element 220. Antenna routing line 205 can extend in a direction perpendicular to the direction the interconnection element 214a extends. Further, in one example, antenna routing line 205 is comprised of five shorter routing lines 205a, 205b, 205c, 205d, 205e, each of which, in this example, changes direction from the prior shorter routing line and extends perpendicular to the prior shorter routing line. In other examples, fewer shorter routing lines, a greater number of shorter routing lines, and any shape of routing line can be provided. For example, antenna routing line may be circular and include only a single routing line that does not change directions and instead extends continuously in the same direction in a helical pattern.

Antenna routing line 205 overlies a major surface of microelectronic element 220, and in this example, overlies the rear surface 228 of microelectronic element 220. The antenna routing line 205 can further extend beyond at least one lateral edge surface of the microelectronic element, and in this example, extends beyond two opposed lateral edge surfaces 226a, 226b of the microelectronic element 220. But, in other examples, the antenna routing line 205 may additionally or alternatively extend beyond only one of the lateral edge surfaces 226a, 226b, or additionally or alternatively extend beyond one or both of the other two opposed surfaces 226c, 226d of the microelectronic element 220.

As in the previous examples, an encapsulant 234 may be used to encapsulate at least the microelectronic element 220 and each of the interconnection elements 214, 214a in the microelectronic assembly. As shown, the encapsulant may be positioned between the antenna 218 and rear surface 228 of microelectronic element 220. In such example, the antenna 218 (including antenna routing line 205) directly overlies both the microelectronic element 220 and encapsulant 234. In other examples, the antenna 218 may directly overlie the rear surface 228 of microelectronic element 220 or overlie an intermediate material or structure, such as a TIM (not shown) or any other material discussed herein, that may be positioned between the antenna 218 and the rear surface 228 of microelectronic element.

The antenna routing lines 205 can be patterned to radiate high frequency electromagnetic waves. Various geometric antenna patterns can be created from the back side routing layer 205 to achieve the frequency required of the antenna. Antennas manufactured according to the present disclosure can possess any desired frequency. For example, antennas for microelectronic assemblies or chip packaging are commonly manufactured for frequencies between 300 MHz and 2500 MhZ. In other examples, wave frequency may be 300 GHz.

One or more of the remaining back side conductive connections may be further used to carry power, ground, or a signal. Back side conductive components 210A, 210B, 210C, 210D, 210E can be identical to previous back side conductive components disclosed herein and may comprise an interconnection element 214 integrally formed with a back side routing layer 212. For example, back side conductive component 210A may include an interconnection element 214a integrally formed with back side routing line 212. The back side routing line 212 may, for example, comprise a trace that can carry a signal to or from another component (not shown) within or external the microelectronic assembly. As shown, the back side routing line 212 extends across the top surface 236 of the encapsulant 234, and in some examples, can further overlie the microelectronic element 220. In still other examples, back side conductive component 210C can provide a conductive connection to a ground plane, whereas back side conductive component 210D (FIG. 7) can carry power. A greater or fewer number of back side conductive components can be provided for within the microelectronic assembly, as needed.

Figure 9:
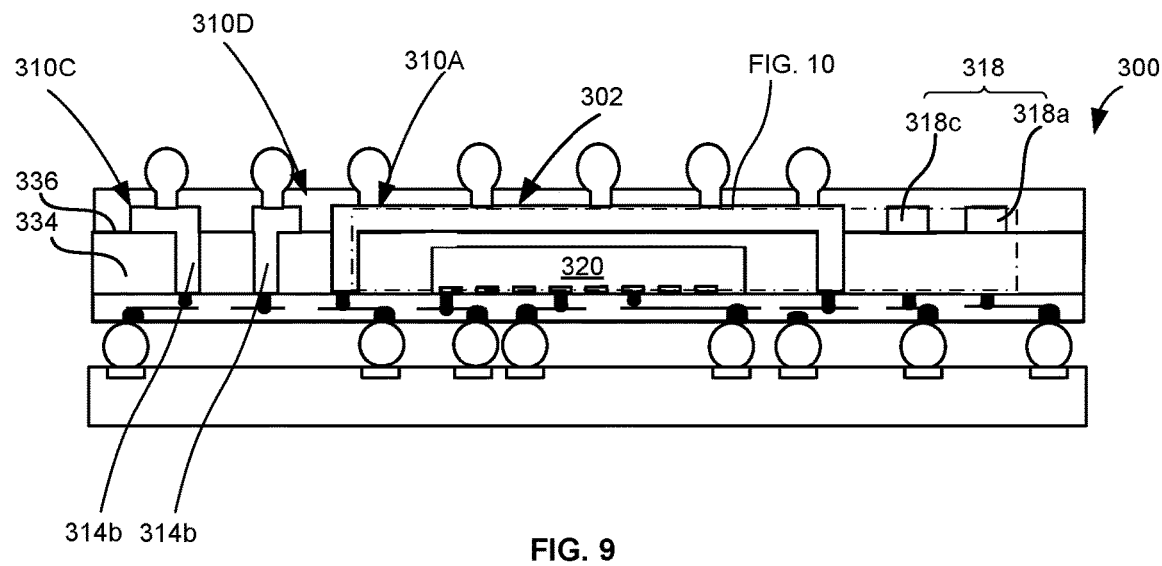
FIG. 9 is a schematic cross-sectional view of an example microelectronic assembly in accordance with another aspect of the disclosure.
Figure 10:
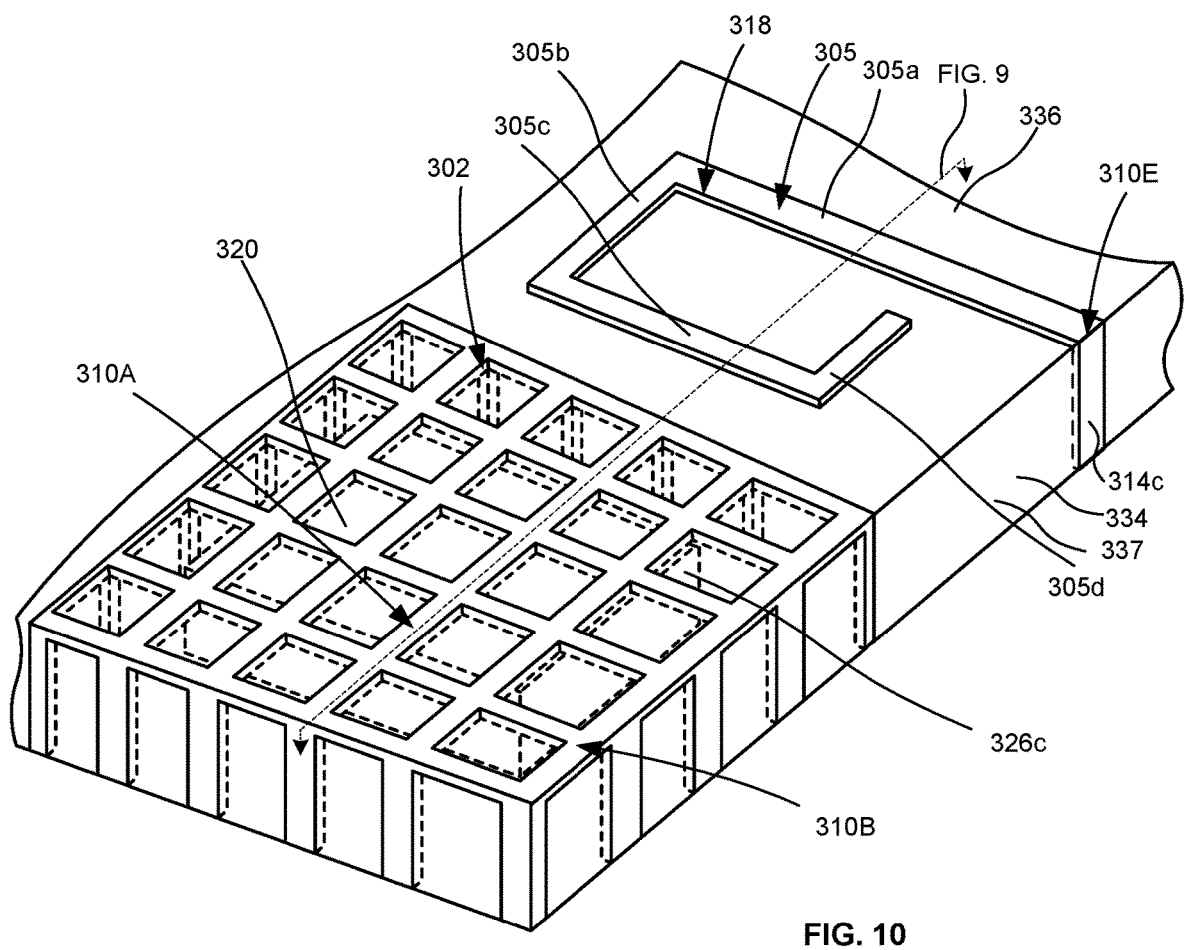
FIG. 10 is a schematic perspective cross-sectional view of an example portion of the microelectronic assembly of FIG. 9.

FIGS. 9-10 illustrate an example microelectronic assembly 300 that includes both an EMI shield structure and an antenna. FIG. 9 is a schematic cross-sectional view that includes the portion of the assembly taken across the line "FIG. 9" identified in FIG. 10. FIG. 10 is a schematic and perspective cross-sectional view of a portion of the microelectronic assembly 300 that illustrates an example EMI shield structure 302 and an example antenna 318. As shown, FIG. 10 depicts the portion of the microelectronic assembly 300 identified in FIG. 9.

With reference first to FIG. 9, encapsulated microelectronic element 320 and a plurality of back side conductive components, including back side conductive components 310A, 310B, 310C, 310D, 310E (FIG. 10) (collectively back side conductive components of microelectronic element 320) may be provided within the microelectronic assembly 300. As in the prior examples, such as in FIGS. 1-3, some of the back side conductive components, such as back side conductive components 310A and 310B can be arranged together to form an EMI shield, such as EMI shield structure 302. At least one other back side conductive element 310E can be configured to form an antenna, such as antenna 318.

The EMI shield structure 302 and antenna 318 can be formed at the same time from an integral or continuous unitary structure (FIGS. 11A-11C and FIGS. 14A-14C) that is at least partially pre-processed prior to encapsulation within the assembly 300. EMI shield structure 302 can be identical to the EMI shield structure 102 discussed with regard to FIGS. 1-3, and reference is made to the detailed discussion of FIGS. 1-3 without reproduction here. Antenna 318 may be positioned laterally adjacent the microelectronic element 320. Further, in this example, antenna 318 may be further positioned outside of and laterally adjacent the EMI shield structure 302.

Antenna 318 can continuously extend from and be integrally formed with at least one interconnection element, such as interconnection element 314C. As shown, interconnection element 314c may be flush with an edge surface 337 of the encapsulant 334 and extend in a vertical or upright direction that is parallel to the edge surface 326c of microelectronic element 320. In other examples, interconnection element 314c may overlie the edge surface 337 of the encapsulant 334 or may be fully encapsulated by the encapsulant 334. Antenna 318 may extend in a direction perpendicular to the direction the interconnection element 314c extends. As shown, antenna 318 may extend across an interconnection or top surface 336 of encapsulant 334. The antenna 318 can take on any geometric shape, but in this example, the antenna routing line 305 includes four smaller routing lines 305a, 305b, 305c, 305d that extend in directions that are perpendicular to one another.

A method of fabricating a microelectronic assembly similar to microelectronic assembly 100 of FIG. 1 according to aspects of the disclosure will now be described relative to FIGS. 11A-11J, where similar reference numerals will be used to identify similar features. Turning first to FIG. 11A, a microelectronic element 420 may be supported on a carrier 470, either directly thereon, or through an intervening layer (not shown) which may be a peelable or other sacrificial layer. The carrier 470 can include or be made of glass, metal, silicon, or other material which can be removed by subsequent processing.

The height H2 of the microelectronic element may vary depending on the application. In some examples, the height H2 of the microelectronic element 420 may vary from 50-100 microns. The height H1 can be greater than 100 microns or less than 50 microns. In an example where the height H2 of the microelectronic element is approximately 100 microns, the conductive structure 472 may have a thickness T ranging from 0.2 mm to 2 mm. In some examples, the thickness may be greater than 0.2 mm, or less than 0.2 mm, or greater than 2 mm.

A conductive structure 472 can be used to provide back side routing and interconnection elements. An example conductive structure 472, prior to being patterned, is illustrated in FIG. 11B. In one example, the conductive structure 472 may be formed from a layer of conductive material. The conductive material can include a planar first surface 474 and an opposed planar second surface 476. The selected conductive material can be any conductive material or combination of materials. In some examples, the conductive material may include at least one of copper, nickel, tungsten, cobalt, palladium, gold, silver, alloy, and/or their respective alloys.

The conductive structure 472 may be a unitary and/or monolithic structure that is subsequently patterned, such as by etching or other known means, to include a plurality of interconnection elements. In some examples, the unitary structure may be formed by a plurality of layers of the same or different material. Example interconnection elements include interconnection elements 414, $414a_1$, $414a_2$, $414b1$ (FIG. 11D), $414b_2$ (FIG. 11D) (collectively "interconnection elements"). As in the prior discussions, where needed to facilitate discussion, interconnection elements that form the EMI shield structure 402, will also be referred to as EMI shield interconnection elements 414, $414a_1$, $414a_2$, $414b1$, $414b_2$. The interconnection elements 414, 414, $414a_1$, $414a_2$, $414b1$, $414b_2$ may be formed by partial etching or etching portions of the conductive structure 472 to a height H1 that is less than the thickness of the overall conductive structure prior to etching. The height H1 may be, in some examples, one-half or three-fourths of the thickness T of the conductive material prior to etching (FIG. 11B). But, in other examples, the height H1 may be greater than, less than, or between these amounts.

The interconnection elements 414, $414a_1$, $414a_2$, $414b_1$, $414b_2$ may extend outwardly and away from the base of the conductive structure 472. An example base 480 can include a first outer surface 479 that is planar (which is the same surface as the first surface 474 of the conductive material 472), an opposed second surface 481 that is parallel to the first outer surface 474, and an edge surface 487 that extends between the first and second surfaces 479, 481. A first portion 483 of each of the interconnection elements 414, $414a_1$, $414a_2$, $414b_1$, $414b_2$ is disposed at and extends continuously from the second surface 481 of the base 480 of the conductive structure 472. The interconnection elements 414, $414a_1$, $414a_2$, $414b_1$, $414b_2$ can include edge surfaces 485 that extend from the second surface 481 of the base 480 to opposed outer ends 486 of the respective interconnection element 414, $414a_1$, $414a_2$, $414b_1$, $414b_2$. As shown, the outer ends 486 of the interconnection elements 414, $414a_1$, $414a_2$, $414b_1$, $414b_2$ are exposed. The spacing and number of interconnection elements 414, $414a_1$, $414a_2$, $414b_1$, $414b_2$ may vary based upon the number of desired connections. In one example, the rows of interconnection elements 414 that are not a part of the EMI shield structure 420 include six interconnection elements 414 in a single row. But, a greater or fewer number of interconnection elements may also be utilized.

A plurality of recessed areas 478A-478G may be formed between each of the interconnection elements 414, 414$a_1$, 414$a_2$, 414$b_1$, 414$b_2$ and can vary in width. Recessed area 478D is a central recessed area or a die attach area that includes a width W1 that is at least large enough to receive the width of a microelectronic element. The interconnection elements 414 disposed on either side of the die attach area 478D may be equally spaced apart from one another. However, any desired pitch can be achieved. In this example recessed areas 478B-C and 478E-F may have widths W2 that are equal to the widths W3 of recessed areas 478A and 478G. In other examples, the widths W2 and W3 may differ. For example, widths W2 may be less than the widths W3 and vice versa.

The boundary or edge of a recess can be defined by a sidewall edge of one of the interconnection elements 414, 414$a_1$, 414$a_2$, 414$b_1$, 414$b_2$. For example, the edges 485 of two adjacent interconnection elements 414, 414$a_1$, 414$a_2$, 414$b_1$, 414$b_2$ and a floor 477 defined by the second surface 481 of the base 480 form the boundaries of the recessed area, such as recessed area 478B. Peripheral recessed areas 478A and 478G will only have a single interconnection element 414, 414$a$1, 414, 414$a_2$, 414$b$1, 414$b_2$ directly adjacent the recessed area, such that only one recessed wall surface is present. The central recessed area 478D can be the largest of the recessed areas and can be sized to receive one or more microelectronic elements therein.

The conductive structure 472 may be patterned to accommodate the height H2 (FIG. 11A) of the microelectronic element by one-half etching when forming the interconnection elements 414, 414$a_1$, 414$a_2$, 414$b$1, 414$b_2$. In some examples, the interconnection elements 414, 414$a_1$, 414$a_2$, 414$b$1, 414$b_2$ may have a height H1 ranging from 50 μm to 400 μm, but generally need to be able to accommodate the height of the microelectronic element 420 and/or other electronic devices that may be in the assembly. In some examples, the height H1 may be less than 50 μm, greater than 50 μm, or greater than 400 μm.

Figure 11D:
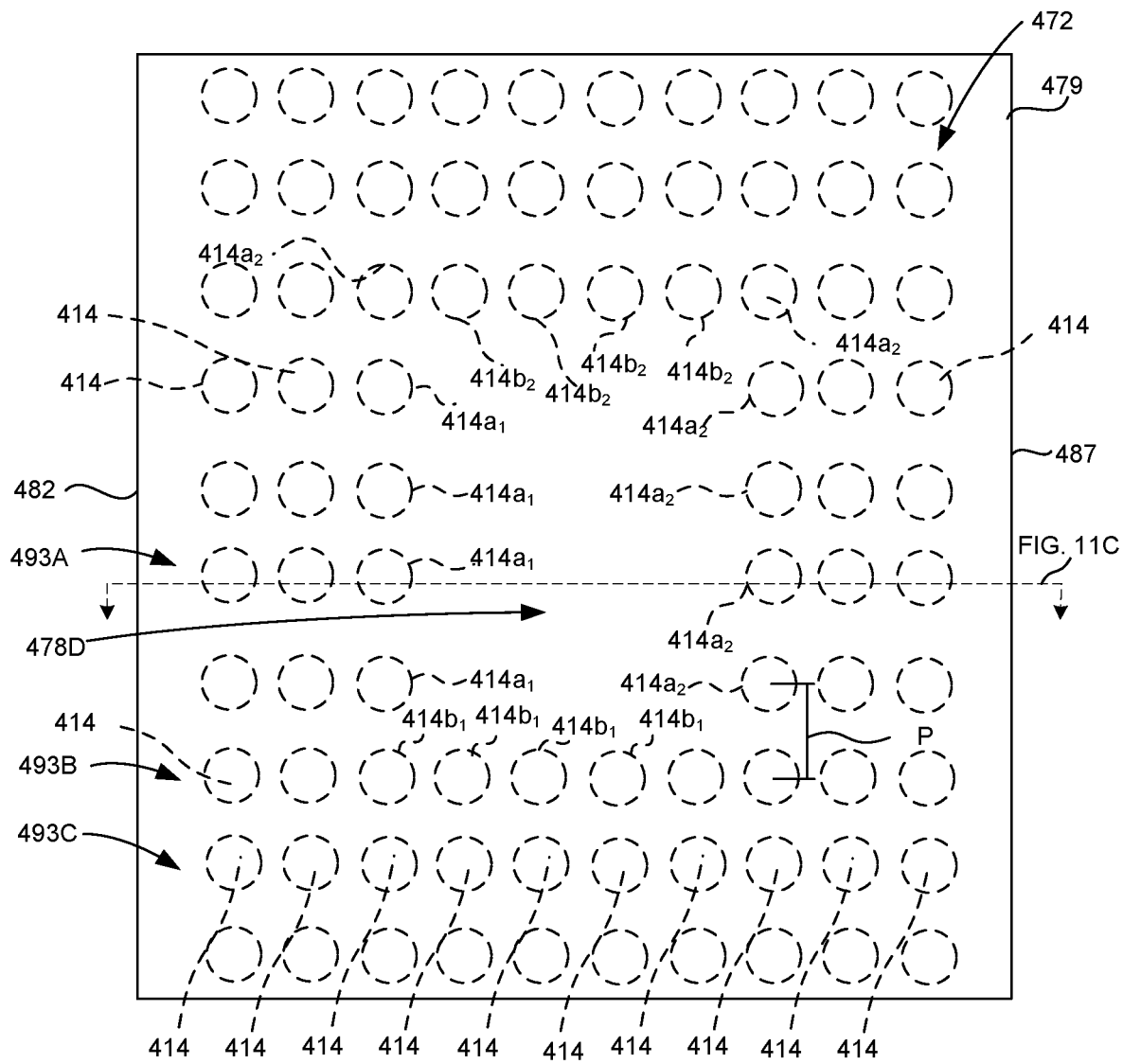

Any number of interconnection elements 414, 414$a_1$, 414$a_2$, 414$b$1, 414$b_2$ can be patterned from the conductive structure 472 in any desired pattern or shape. The top view of FIG. 11D shows the top surface 479 of base 480. An example arrangement of the etched conductive structure 472 and interconnection elements 414, 414$a_1$, 414$a_2$, 414$b$1, 414$b_2$ is shown in broken lines (since the posts are not visible from the top view). An array of interconnection elements 414$a_1$, 414$a_2$, 414$b$1, 414$b_2$ can extend across the bottom surface 481 of base 480 of the conductive structure 472. Each of the interconnection elements 414, 414$a_1$, 414$a_2$, 414$b$1, 414$b_2$ in this example have a circular or rounded cross-section. In this example, the interconnection elements 414, 414$a_1$, 414$a_2$, 414$b$1, 414$b_2$ may have a cross-section that is constant along its length H1, but in other examples, the cross-section may vary. Similarly, in other examples, the interconnection elements 414, 414$a_1$, 414$a_2$, 414$b$1, 414$b_2$ may have a different shaped-cross section, such as a square, a rectangle or other shape. Further, in other examples, the cross-section of the interconnection element may be uniform along the length H1. In still other examples, the interconnection elements 414, 414$a_1$, 414$a_2$, 414$b$1, 414$b_2$ may have different shapes and sizes relative to one another.

Several interconnection elements can be arranged together to form a first part of an EMI shield structure, as will be discussed in more detail herein. For example, some of the interconnection elements may be EMI shield interconnection elements that are positioned adjacent recess 478D and can form EMI shielding in an area around the recess 478D, which is configured to receive one or more microelectronic elements. In one example, EMI shield interconnection elements 414$a_1$, 414$a_2$, 414$b$1, 414$b_2$ may further extend around all or a part of the peripheral or lateral edge surfaces 426$a$, 426$b$, 426$c$, 426$d$ of the microelectronic element 420. For purposes of discussion, it is to be understand that the EMI shield interconnection elements 414$a_1$, 414$a_2$, 414$b$1, 414$b_2$ are otherwise similar to the remaining interconnection elements in the assembly and discussions regarding interconnection elements 414 are similarly applicable to interconnection elements used to form an EMI shield structure, including EMI shield interconnection elements 414$a_1$, 414$a_2$, 414$b$1, 414$b_2$.

As previously discussed, the EMI shield interconnection elements 414$a_1$, 414$a_2$, 414$b$1, 414$b_2$, may be patterned from the conductive component 472 so that the EMI shield interconnection elements 414$a_1$, 414$a_2$, 414$b$1, 414$b_2$ have a predetermined and center-to-center pitch P that can provide necessary EMI shielding. Formation of EMI shield interconnection elements 414$a_1$, 414$a_2$, 414$b$1, 414$b_2$ around recess 478D forms the first part of the EMI shield structure that will eventually provide EMI shielding of components within central recess 478D.

The number of overall interconnection elements 414, 414$a_1$, 414$a_2$, 414$b$1, 414$b_2$ in any one row can be the same or vary from another row. For example, due to the central die attach area 478D, the array of interconnection elements that extend in a lateral direction (parallel to an axis extending between the lateral surfaces 426$a$, 426$b$ of microelectronic element 420) may vary between rows. In one example, the number of interconnection elements 414, 414$a_1$, 414$a_2$ in a first row 493A that extends through die attach area 478D may be less than the number of interconnection elements that extend in a second row 493B and don't extend through the recessed or die attach area 478D. However, the number of interconnection elements 414, 414$b$1, 414$b_2$ in the second row 493B can be the same as the interconnection elements 414 in a third row 493C.

Figure 11E:
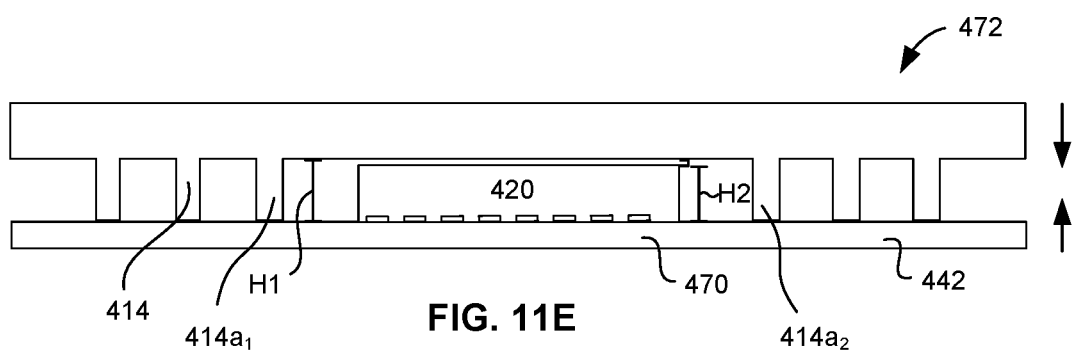

The patterned conductive structure 472 can be joined together with the carrier 470 and the microelectronic element 420, as shown, for example, in FIG. 11E. The patterned conductive structure 472 can be removably attached or bonded to the carrier by an adhesive material (not shown) or other means of attachment. The microelectronic element 420 is shown fully positioned within the recessed area 478D. In this example, the height H1 of the interconnection element 414 and the recessed areas 478A-G is greater than a height H2 of the microelectronic element.

Figure 11F:
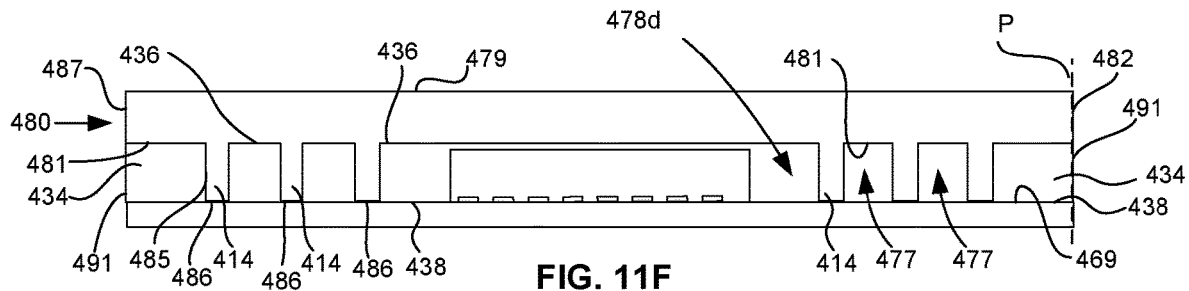

As seen in FIG. 11F, a dielectric encapsulant may be provided to encapsulate the microelectronic element 420 and each of the interconnection elements, including interconnection elements 414 and EMI shield interconnection elements 414$a_1$, 414$a_2$, 414$b$1, 414$b_2$ (FIG. 11D). In one example, an encapsulant 434 occupies and fills the space between each of the interconnection elements 414, 414$a_1$, 414$a_2$, 414$b$1, 414$b_2$. As shown, the encapsulant 434 is adjacent each of the edges 485 of the interconnection elements 414, 414$a_1$, 414$a_2$, 414$b$1, 414$b_2$. The encapsulant 434 can have outer edge 491 aligned with and extending along the same plane P as the outer edges 482 of the base 480 of the conductive structure 472. A top edge 436 of the encapsulant 434 can be coplanar with and positioned directly adjacent the second surface 481 of the base 480. A bottom surface 438 of the encapsulant 434 can be coplanar with and positioned directly adjacent the outer ends 486 of the interconnection elements 414, 414$a_1$, 414$a_2$, 414$b$1, 414$b_2$. Encapsulant can also be positioned between the rear surface 428 of the microelectronic element 420 and the inner surface 481 of the base 480.

In one example, the dielectric encapsulation can be formed by flowing an encapsulant into a mold onto the elements shown in FIG. 11E to form a molded encapsulation. At the time of encapsulation, the ends of the interconnection elements 414, 414$a_1$, 414$a_2$, 414$b$1, 414$b_2$ are unexposed and remain covered by the carrier 470. Such encapsulation 434 may in some cases in the final assembly resist strain due to mismatch between coefficients of thermal expansion between the encapsulation, the microelectronic element, the carrier 470, and the redistribution structure 440 (FIG. 11H), which can be attached and electrically connected thereto.

Figure 11G:
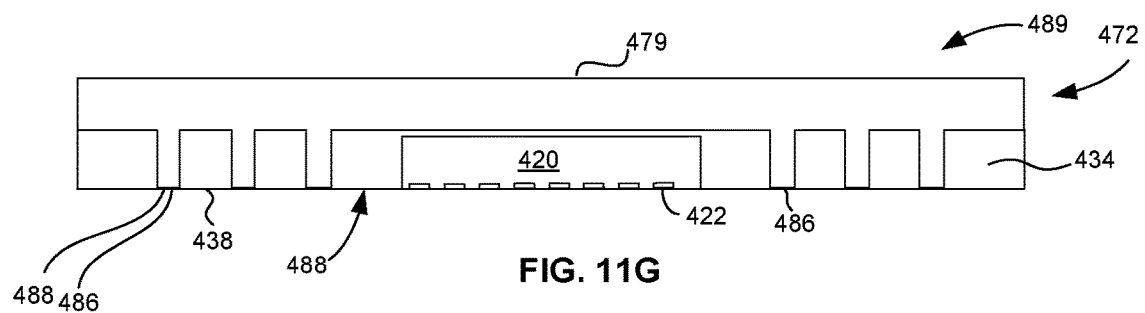
Figure 11H:
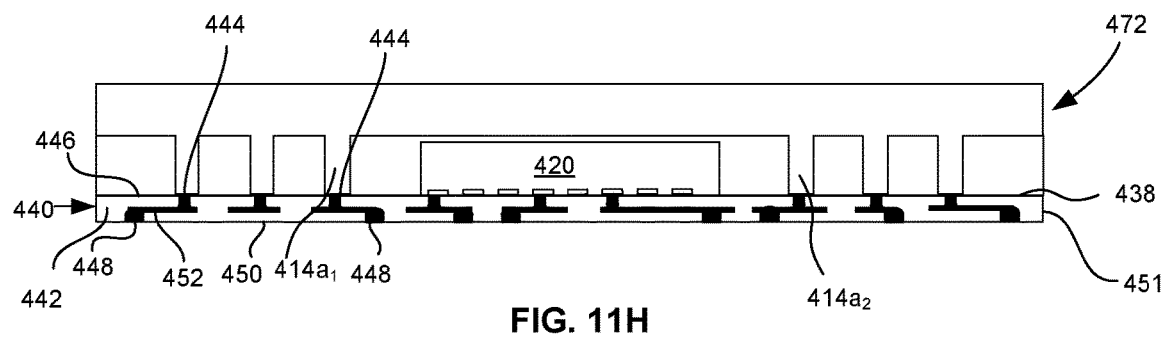

Thereafter, as seen in FIG. 11G, the carrier 470 can be removed to form an encapsulated in-process assembly 489, which exposes an interconnection surface 488 thereat, which are also the outer ends 486 of the interconnection elements 414. The exposed ends outer 486 of the interconnection elements 414, 414$a_1$, 414$a_2$, 414$b$1, 414$b_2$, the bond pads 422 of the microelectronic element 420, and the bottom surface 438 of the encapsulant 434 extend along a substantially planar line and form an interconnection surface 488.

A first part of an EMI shield structure 402 (FIG. 11I) can be formed by the arrangement of EMI shield interconnection elements 414$a_1$, 414$a_2$, 414$b$1, 414$b_2$ around the microelectronic element 420. In one example, the EMI shield structure 402 can be formed by the arrangement of EMI shield interconnection elements 414$a_1$, 414$a_2$, 414$b$1, 414$b_2$ around one or more peripheral edge surface 426$a$, 426$b$, 426$c$, 426$d$ of the microelectronic element 420. The closely spaced EMI shield interconnection elements 414$a_1$, 414$a_2$, 414$b$1, 414$b_2$ around microelectronic element 420 can provide EMI shielding. In some examples, the EMI shield interconnection elements 414$a_1$, 414$a_2$, 414$b$1, 414$b_2$ can be spaced apart from one another or have a center-to-center pitch P that may range from 100 μm to 1 mm. But, in other examples, the pitch may be less than 100 μm, greater than 100 μm, or greater than 1 mm. In one example, the pitch may be 300 μm. In still other examples, the pitch may be at least 300 μm. The pitch between two adjacent EMI shield interconnection elements 114$a_1$, 114$a_2$, 114$b_1$, 114$b_2$ may be the same for some or all EMI shield interconnection elements 114$a_1$, 114$a_2$, 114$b_1$, 114$b_2$ or can differ throughout. Although not required, a redistribution structure can be provided at the interconnection surface. The redistribution structure, such as, for example, the redistribution structure 440 shown in FIG. 11H, can be prefabricated prior to its electrical connection to the interconnection elements 414, 414$a_1$, 414$a_2$, 414$b$1, 414$b_2$ and bond pads 422 of the microelectronic element 420. The redistribution structure 440 may have a front surface 446, a rear surface 450, and an edge surface 451. In one example, the prefabricated redistribution structure may first be manufactured on a temporary carrier (not shown) and later joined to the interconnection surface 488 of the redistribution structure 440. Alternatively, the redistribution structure 440 can be manufactured directly thereon with a standard wafer level packaging process. In still other examples, a redistribution structure may be altogether omitted form the assembly.

In the example of forming the redistribution structure directly thereon, the process can be performed so as to form a plurality of dielectric layers 442 and electrically conductive features such as described above with reference to FIG. 1. For example, the dielectric layers 442 to be formed can include the front contacts 444 at the front surface 446 of the redistribution structure 440. The last one of the dielectric layers 442 to be formed can include rear conductive elements 448 at the rear surface 450 of the redistribution structure 440. The rear conductive elements 448 can be electrically coupled to the front contacts 444 by the conductive traces 452. In examples where the conductive structure 472 is patterned after the redistribution structure is provided, the redistribution structure 472 can help prevent warping and twisting of the package.

The conductive structure 472 and in some examples, the base 480 can be further processed and patterned to form a plurality of back side conductive components. As shown, for example, in FIG. 11I, the conductive structure 472 can be thinned and patterned by etching to form a plurality of back side conductive components 410, 410A, 410B (11J).

At least some of the back side conductive components can further include a back side routing layer that extends continuously from and is integrally formed with one of the interconnection elements and that can be configured to create any number of electronic interconnections. For example, some of the back side conductive components can be configured and patterned to form an EMI shield structure, while other of the back side conductive components may be patterned to form other conductive components, such as antennas, traces, and the like. In some examples, the back side conductive components 410 that do not form part of the EMI shield structure 402 can be patterned to include an interconnection element 414 that is integrally formed from back side routing line 412. Such back side routing lines 412 may be an antenna, a trace, and/or or carry power, ground, or a signal. The EMI shield back side conductive components 410A, 410B that form part of the EMI shield structure 402 can include EMI shield interconnection elements 414$a_1$, 414$a_2$, 414$b$1, 414$b_2$ that are integrally formed with and patterned to include at least one EMI shield back side routing line, such as EMI shield back side routing lines 404$a$, 404$b$, as discussed in more detail below.

Figure 11I:
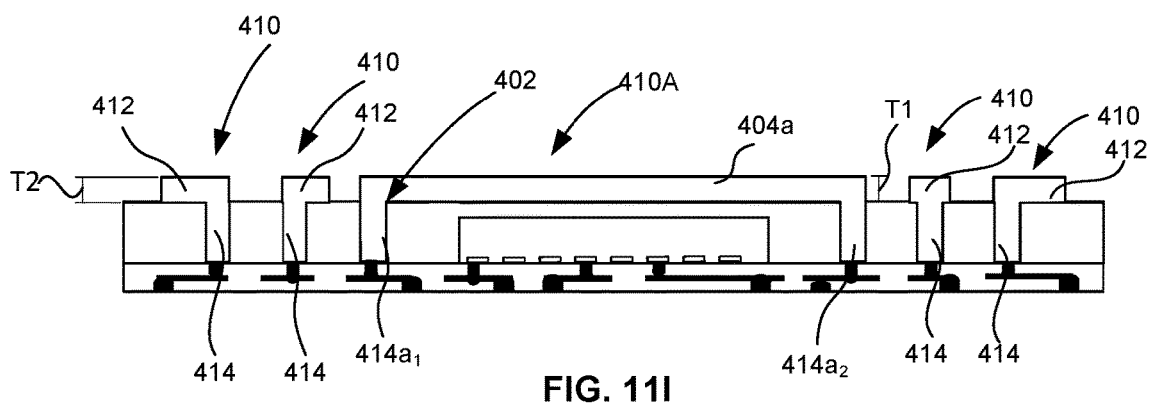
Figure 11J:
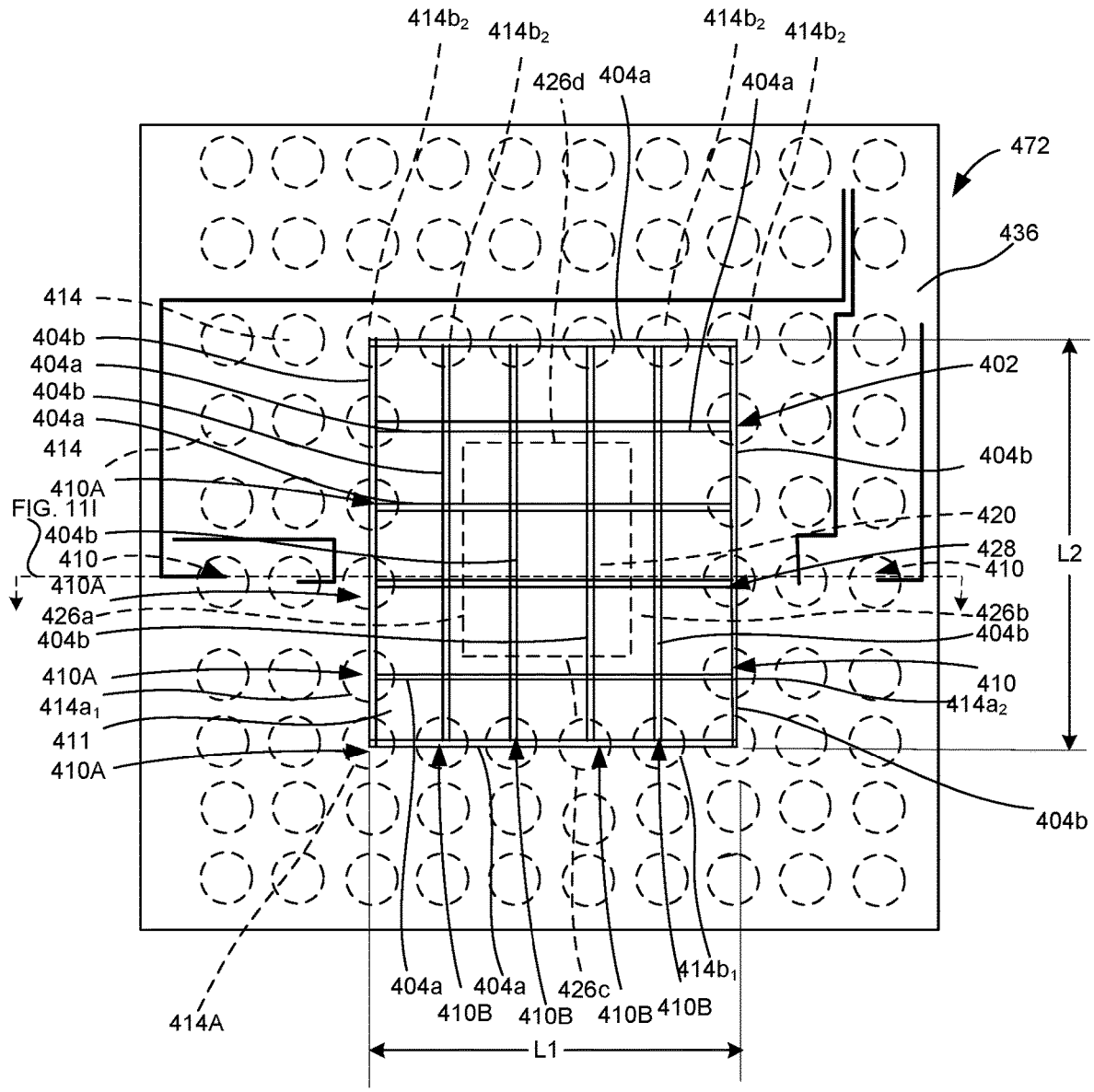

FIG. 11J, a top down view of the in-process unit of FIG. 11I, illustrates patterning of the back side routing lines from the conductive component 472. As shown, some of the back side conductive components may be EMI shield back side conductive components 410A, 410B. A second portion of EMI shield structure 402 can also be formed by patterning of the conductive component 472. In one example, the outer surface 479 of the base 480 of the conductive component 472 can be patterned to form a grid-like pattern and a major surface 411 of the EMI shield structure 402. The base 480 can be patterned with EMI horizontal back side routing lines 404$a$. As shown, horizontal back side routing lines 404$a$ are etched to extend in a direction parallel to a direction extending between the opposed lateral surfaces 426$a$, 426$b$ of the microelectronic element. In this example, the horizontal back side routing lines 104$a$ have an overall length L1 defining the width of the magnetic shield 402. Some of the horizontal back side routing lines 404$a$ will overlie the rear surface 428 of the microelectronic element 420.

The perpendicular back side routing lines 404$b$ can extend perpendicular to and intersect with the horizontal back side routing lines 404$a$. The perpendicular back side routing lines 404$b$ further extend in a direction parallel to a direction extending between the opposed surfaces 425$c$, 425$d$ of the microelectronic element 420. Some of the vertical back side routing lines 404$b$ overlie the rear surface 428 of the microelectronic element 420. In this example, the perpendicular routing lines 104b have an overall length L2 defining the length of the EMI shield structure 402. The horizontal back side routing lines 404a and the perpendicular back side routing lines 404b can be collectively referred to as "EMI shield back side routing lines" or "back side routing lines."

At least one end of each of the EMI shield back side horizontal and perpendicular back side routing line 404a, 404b can extend continuously from an interconnection element, such as one of EMI shield interconnection elements $414a_1$, $414a_2$, 414b1, $414b_2$. As shown in this example, a horizontal back side routing lines 404a can continuously extend from and between two interconnection elements $414a_1$, $414a_2$ positioned adjacent opposed edges 426a, 426b of microelectronic element 402. The back side conductive component 410A can, in some examples, include the two interconnection elements $414a_1$, $414a_2$ and the integrally formed back side EMI shield routing layer 404a may be positioned between the two interconnection elements $414a_1$, $414a_2$. The back side conductive component 410A can, in some examples, include the two interconnection elements $414a_1$, $414a_2$ and the integrally formed back side EMI routing layer 404a. Similarly, back side conductive components 410B include perpendicular back side routing lines 404b that are patterned to extend perpendicular to the horizontal back side routing lines 404b. In some examples, the EMI shield back side conductive component 410B will comprise two interconnection elements 414b1, $414b_2$ that are adjacent opposed edges 426c, 426d of microelectronic element 402 and that are joined by the horizontal EMI shield back side routing line 404b.

The arrangement of the EMI shield back side conductive components 410A (including EMI shield interconnection elements 414, $414a_1$, $414a_2$, 414b1, $414b_2$ and back side routing lines 404a, 404b) around microelectronic element 420 forms an EMI shield structure 402 according to aspects of the disclosure. The first portion of the EMI shield structure 402 can be formed with etching of the conductive component 472 to form EMI shield interconnection elements $414a_1$, $414a_2$, 414b1, $414b_2$ around peripheral edge surfaces 426a, 426b, 426c, 426d of microelectronic element 420. The second portion of the EMI shield structure 402 can be formed with patterning of the EMI shield back side routing lines 404a, 404b. In this example, the back side conductive components are integrally formed from the conductive component 472, such that the EMI shield structure is a unitary structure and in some examples, a monolithic structure. Further, in this example, the first portion of the EMI shield structure can be formed prior to encapsulation, whereas the second portion of the EMI shield structure can be formed after encapsulation so as to allow for the EMI shield back side conductive components and the corresponding back side routing lines to extend across the encapsulation surface.

As shown, other back side conductive components 410 that are not arranged to form EMI shield structure 402 are also provided within the microelectronic assembly 400. The back side conductive components 410 may be integrally formed at the same time as the EMI shield layer. Some of the back side conductive components, may further provide connections for signal, power and/or ground.

With reference back to FIG. 11I, the back side routing lines can be patterned to any desired thickness. In this example, the thickness or height T1 of the EMI shield back side routing layer 404a, 404b (FIG. 11J) and thickness or height T2 of the back side routing layers 110 adjacent the EMI shield 410A may range from 2 µm to 500 µm, but in other examples, the shield structure may have a thickness T1/T2 that is less than 2 µm or greater than 500 µm. In still other examples, the thickness T1/T2 may be more than 100 µm. In still other examples, the thickness of the back side routing layers that form the EMI shield back side routing layers and the thickness of the back side routing layers 110 that do not form part of the EMI shield structure 402 may be the same. But, in other examples, the thicknesses may differ.

Figure 11K:
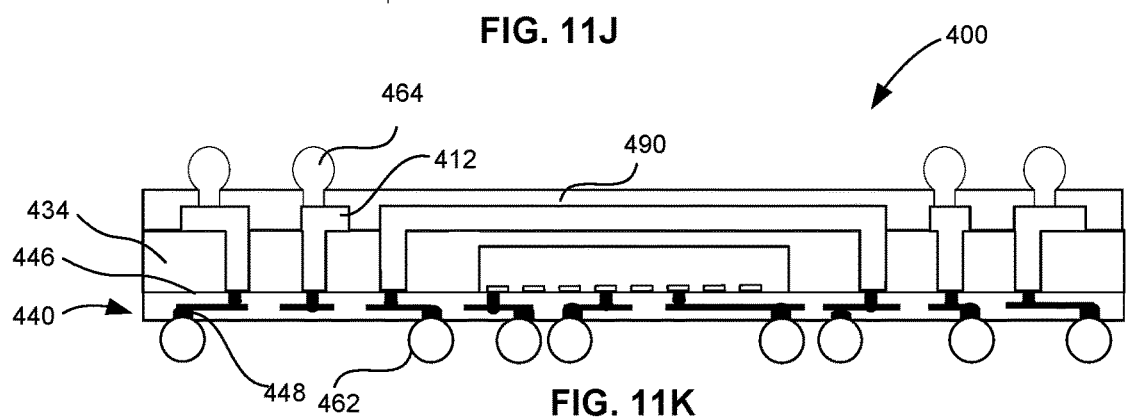

A dielectric layer, such as a solder mask 490 may be provided over the back side routing layer 412 and EMI shield back side routing layers 404a,404b of the back side conductive components 410,410A, 410B as shown in FIG. 11K. Thereafter, openings in the dielectric layer may be formed to allow for conductive masses, such as solder mass 464, to be electrically connected with the back side routing layer 412. Conductive masses 462 may also be provided on the rear conductive elements 448 of the redistribution structure 440. The resulting structure is the microelectronic assembly 400 shown in FIG. 11K (which is similar to the microelectronic assembly 100 of FIG. 1).

In the alternative example where the redistribution structure carrier is pre-formed, the front surface 446 of the redistribution structure may be bonded to the encapsulant 434. In one embodiment, the adhesive may be or include one or more layers of epoxy, elastomer, polyimide or other polymeric material. In some cases, a material used as a conformal dielectric coating over one or more of the microelectronic elements may also function as an adhesive. In one embodiment, such conformal dielectric coating can be a polyxylylene material such as commonly referred to as "parylene". Parylene can also be used as a die attach adhesive between adjacent microelectronic elements.

It is to be appreciated that multiple microelectronic assemblies may be prepared at one time, and then singulated during any desired part of the manufacturing process. For example, with reference back to FIG. 11A, in an alternative example (not shown), instead of a single microelectronic element on a carrier, multiple microelectronic elements may be provided on the carrier and the conductive material 472 may be sized and patterned to include features for multiple conductive components 472. Thereafter, during or after another part of the manufacturing process, such as during preparation of any of FIGS. 11G. to 11K, individual microelectronic assemblies may be singulated. In one example, individual microelectronic assemblies may be singulated after the dielectric layer 490 is applied over the back side conductive components, such as at some during or after formation of the assembly shown in FIG. 11K.

In some examples, a thermal interface material (not shown) may also be provided over the rear surface 428 of the microelectronic element 420 prior to attachment of the conductive structure 472, as shown in FIG. 4B. The thermal interface material layer can alternatively be provided onto the rear surface 428 of the microelectronic element 420 prior to being deposited on the carrier 470. One example method that incorporates a thermal interface material layer into a microelectronic assembly is disclosed in U.S. Pat. No. 10,181,447, which issued on Jan. 15, 2019 and is entitled 3D-Interconnect, and the disclosure of which is incorporated herein by reference in its entirety.

Numerous modifications can be made to the design of the EMI shield structure 402. For example, the number, shape, and size of the interconnection elements that are configured and arranged to provide lateral EMI shielding adjacent side edges of the microelectronic element can widely vary. Further, the patterning of the conductive component 472 to form a major surface of the EMI shield structure can widely vary.

In some examples, it may be desired to modify the design of a major surface of the EMI shield structure by further including additional horizontal and/or back side routing lines to increase the number of back side routing lines and increase the shielding capabilities of the EMI shield structure 402. In some examples, additional back side routing lines can be created and formed from the same conductive component 472 (FIG. 11B) at the same time the back side conductive components 410 are formed. The additional back side routing lines may be EMI shield back side routing lines that are not directly attached to an interconnection element 414A, and may only be indirectly connected to one of the EMI shield interconnection elements 414A through other conductive connectors. For example, another back side routing line may be etched from the conductive layer and indirectly connected to an interconnection element 414 via a trace or other routing line.

Figure 12:
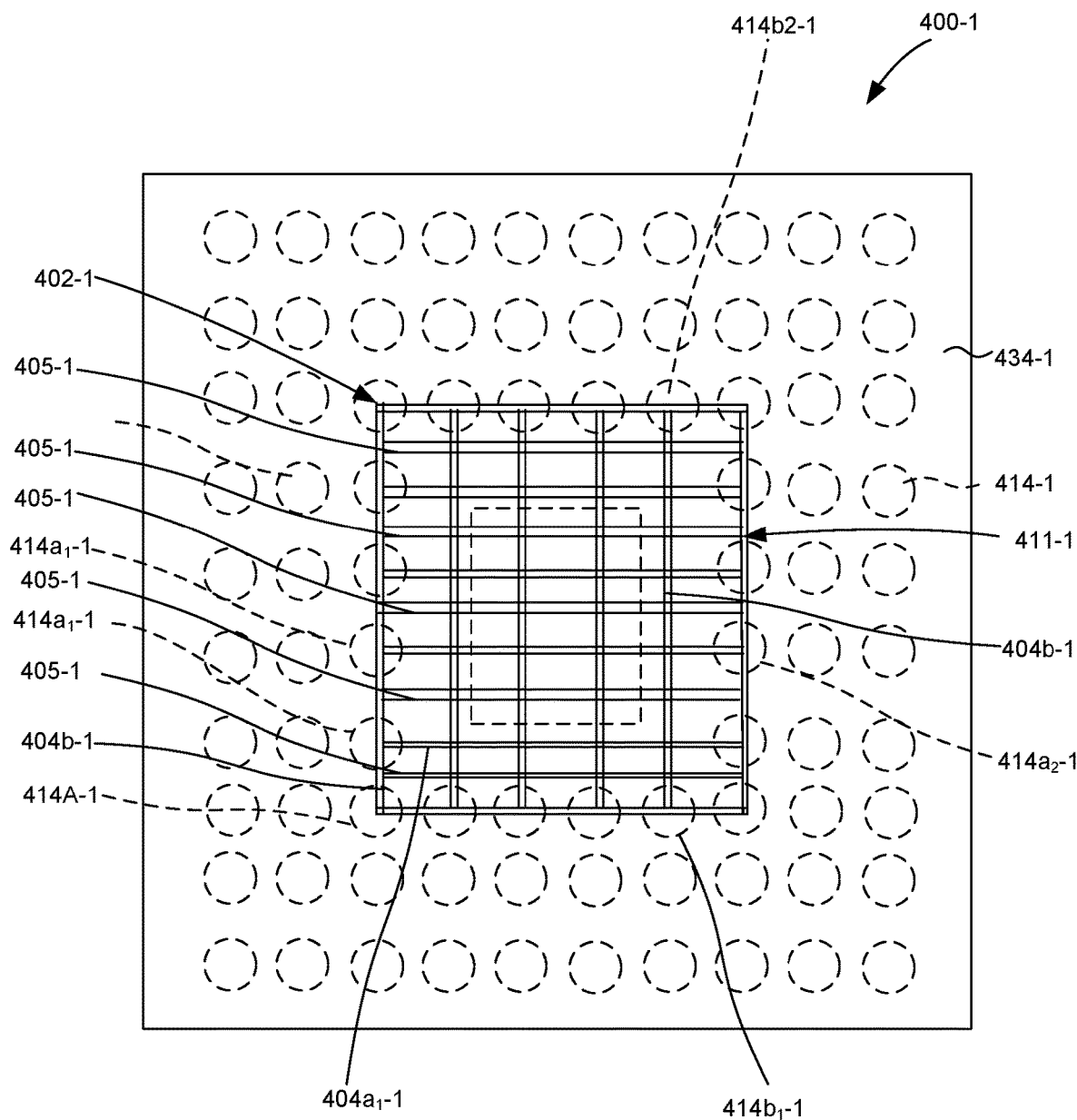
FIG. 12 is a top view of an alternate method of patterning an EMI shield structure according to an aspect of the disclosure.

FIG. 12 illustrates such example method for patterning additional back side routing lines that are indirectly connected to an interconnection element. As in the previous example shown in FIG. 11J, the major surface 411-1 of the EMI shield structure 402-1 may include several horizontal back side routing lines 404a-1 and several perpendicular back side routing lines 404b-1. The horizontal back side routing lines 404a-1 may extend continuously from respective interconnection elements $414a_1$-1, $414a_2$-1 and the perpendicular back side routing lines 404b-1 may extend continuously from interconnection elements 414b1-1, $414b_2$-1. This is similar to the configuration shown and manufactured in FIG. 11J of the prior example. However, in this example, during patterning of the base of the conductive structure (see prior FIGS. 11H-11I), additional horizontal back side routines lines 405-1 may be provided or patterned between two directly adjacent horizontal back side routing lines 404a-1 (i.e., those back side routing lines 404a that have at least one end portion extending directly and continuously from an interconnection element $414a_1$-1). These additional back side routing lines 405-1 will not directly and continuously extend from one or more interconnection elements 414-1 in the assembly, but will alternatively extend from at least one adjacent routing line. For example, as shown, each routing line 405-1 can extend from at least one perpendicular routing line 404b-1. Additional perpendicular back side routing lines (not shown) may additionally or alternatively be provided between two directly adjacent perpendicular back side routing lines 404b-1.

Figure 13:
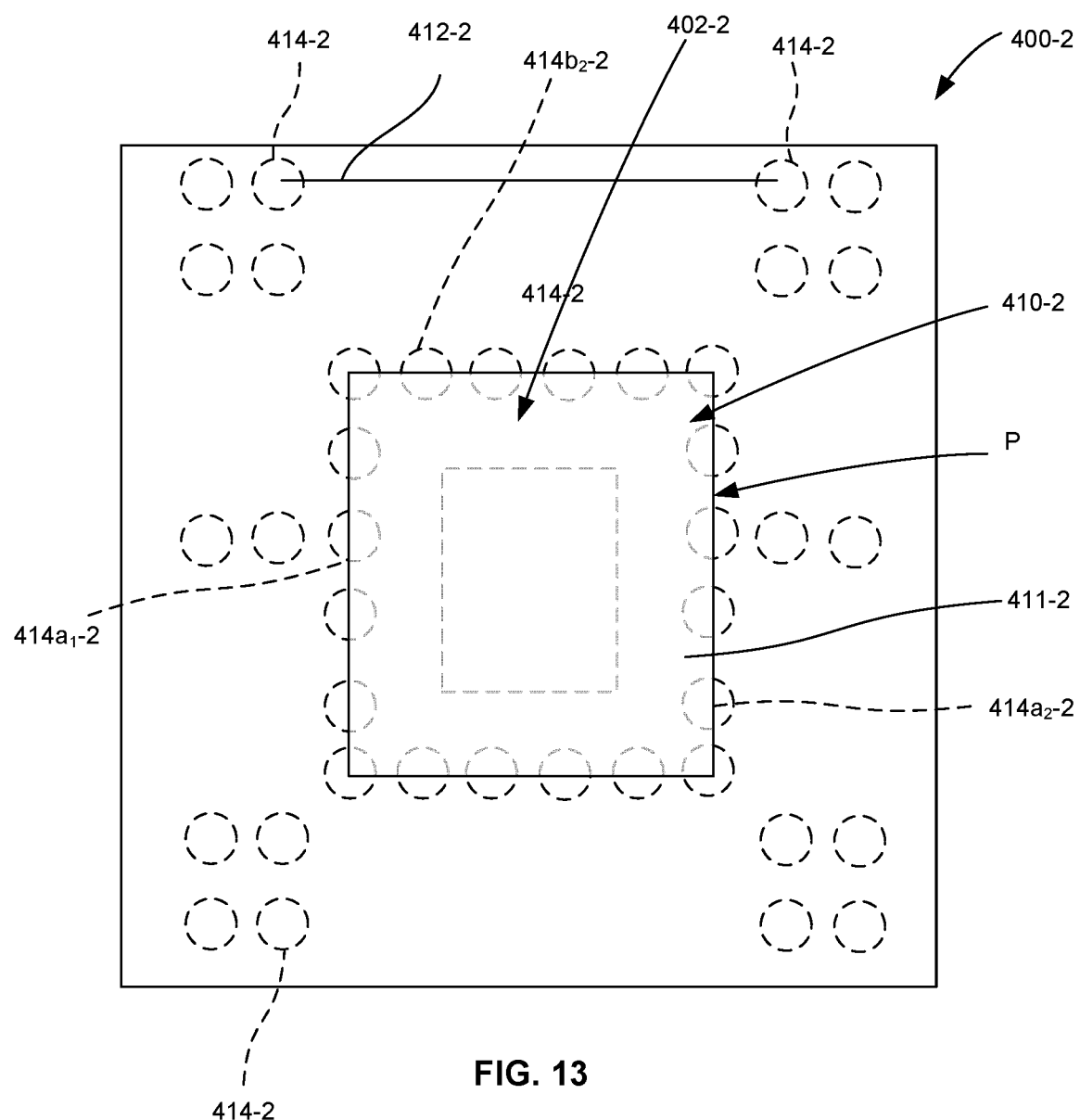
FIG. 13 is a top view of another alternative method of patterning an EMI shield structure according to an aspect of the disclosure.

Another example method of EMI shield structure formation is shown in FIG. 13, which is an exemplary method for forming microelectronic element assembly 100-3 shown in FIGS. 5-6. The components include the same components in FIGS. 11A-11C, but differs in the manufacturing of the back side routing layer. EMI shield structure 402-2 is shown, in which a major surface 411-2 of the EMI shield structure 402-2 is a continuous planar surface, such as discussed with regard to FIGS. 5-6. In this example, the major surface 411-2 of the EMI shield structure 402-2 extends continuously between the EMI shield interconnection elements $414a_1$-2, $414a_2$-2, $414b_1$-2, $414b_2$-2. In this method of formation, individual routing lines are not patterned, as in previous examples, but instead only the peripheral edges of the EMI shield structure 402-2 are patterned to define the shape of the major surface 411-2 of the EMI shield structure 402-2. In this example, the perimeter P of the EMI shield structure 402-2 forms the shape of a square with sharp edges, but in other examples, any other shape or pattern can be formed and/or edges, such as rounded, wavy, can be utilized.

This example further illustrates an alternate arrangement of other interconnection elements 414 in a microelectronic assembly (i.e., those interconnection elements 414-2 that do not form part of the EMI shield structure). As shown, interconnection elements 414-2 are positioned at the corners of the microelectronic assembly 400-2, and a back side routing line 412-2 is shown extending between two interconnection elements 414-2.

A manufacturing process that incorporates back side conductive components, such as back side conductive components 410 and EMI shield back side conductive components 410A, 410B integrally formed at the same time from a pre-processed unitary structure, as opposed to being formed by plating conductive vias or the like, allows for improvements over known assemblies, including a reduction in the overall cost of the assembly, simplified fabrication, improvements on package warpage, small form factor, and various other improvements.

Figure 14A:
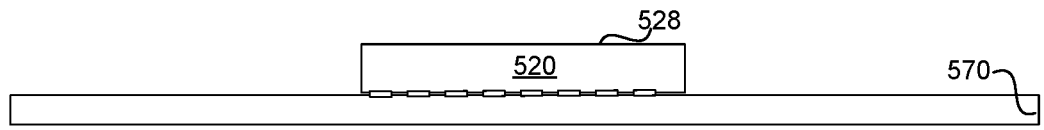
FIGS. 14A-14L illustrate schematic cross-sectional and top views of an example method of making the microelectronic assembly of FIGS. 7-8.
Figure 14B:
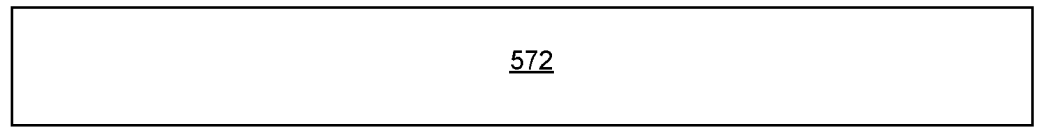
Figure 14C:
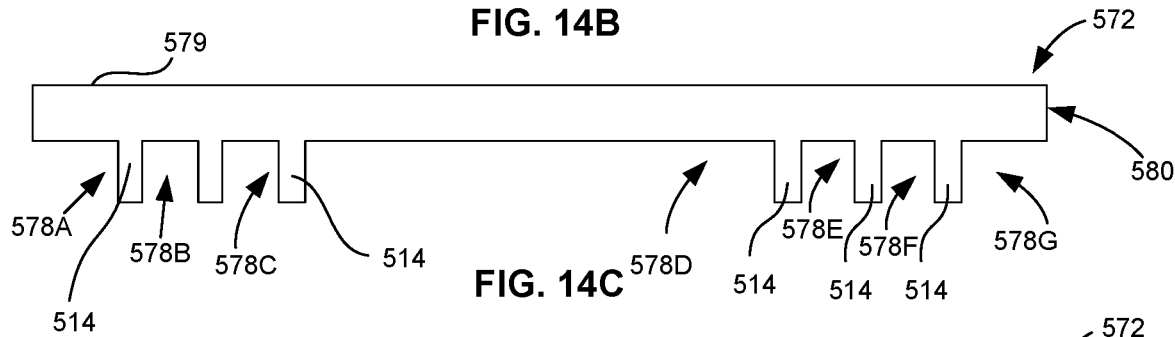
Figure 14D:
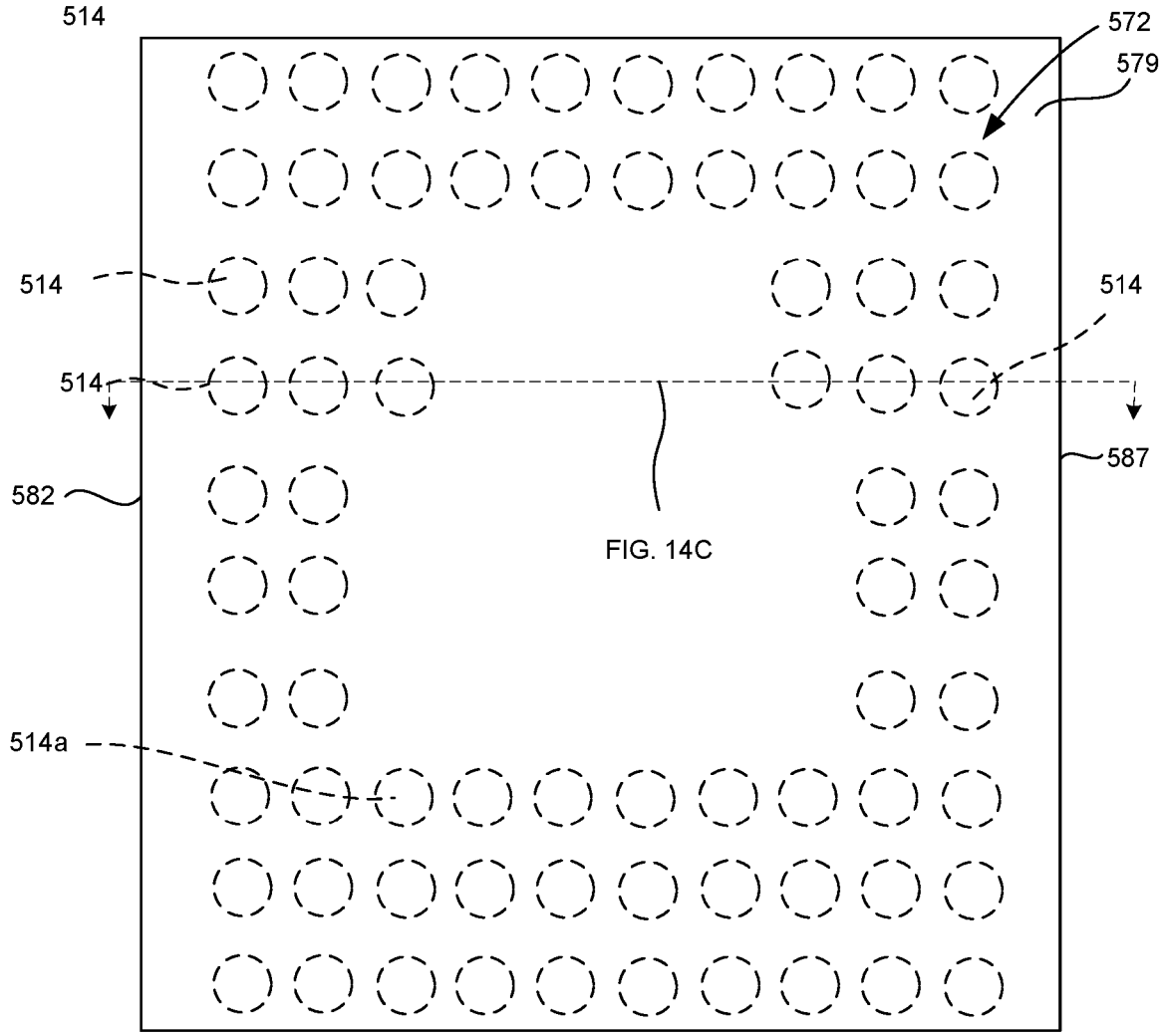
Figure 14E:
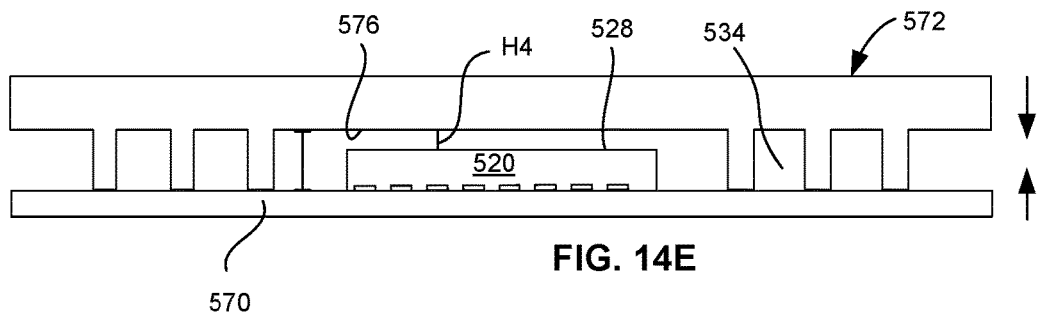

With reference to FIGS. 14A-14J, an example method of assembling a microelectronic assembly that includes an antenna, such as microelectronic assembly 200 described in FIGS. 7-8, is disclosed. The method of manufacturing the assembly is similar to the previous embodiment (FIGS. 11A-11K), except that instead of patterning the conductive component to form an EMI shield structure from the back side conductive components, an antenna is additionally or alternatively patterned or formed. As shown in FIG. 14A, microelectronic element 520 is provided on a carrier 570. The conductive component 572 (FIG. 14B) can be processed (FIG. 14C) in a similar way as previously described in FIGS. 11B-11C to form interconnection elements 514 that extend away from a base 580 and that are spaced apart from one another by recessed areas 578A, 578B, 578C, 578D, 578E, 578F, 578G between the interconnection elements 514. FIG. 14D illustrates a top view of the patterned conductive structure 572. An example arrangement of the etched conductive structure 572 and interconnection elements, including interconnection elements 514 and at least one antenna interconnection element 514a (also referred to as "interconnection element") are shown in broken lines since the posts are not visible from the top view. Patterned conductive structure 572 can be joined with the carrier 570 supporting the microelectronic element 520 (FIG. 14E), such that the conductive component 572 overlies the rear surface 528 of the microelectronic element 520. The rear surface 528 of the microelectronic element 520 may be spaced apart from the second surface 576 of the conductive structure 572 by a distance H4. The distance H4 can be any desired distance. The distance H4 may be greater in circumstances where it may be desired to increase the distance between the microelectronic element and the conductive component 572 to accommodate other features or devices in the assembly. In other examples where it is desired to minimize the overall height of the assembly, the conductive structure 572 can extend along the rear surface 528 of the microelectronic element 520. Still further, in other examples, another material, such as TIM (not shown) may be provided on the rear surface 528 of the microelectronic element 520.

Figure 14F:
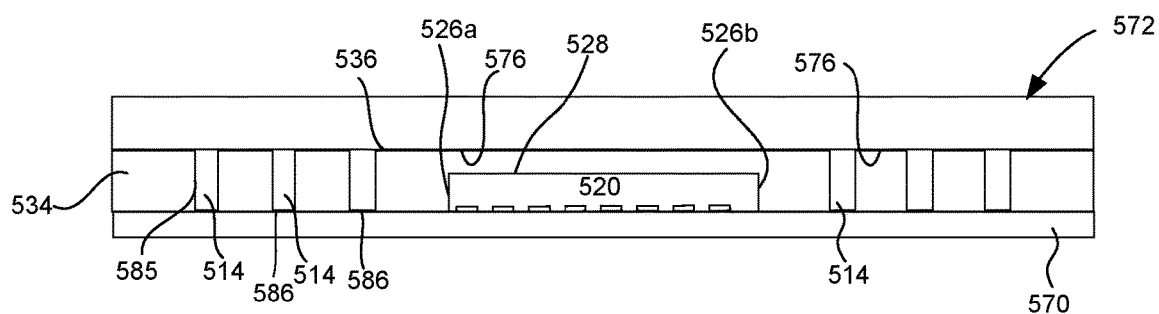
Figure 14G:
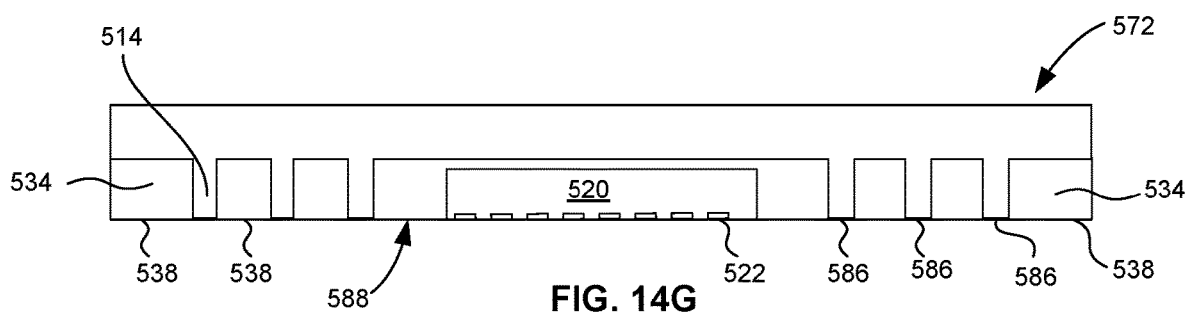
Figure 14H:
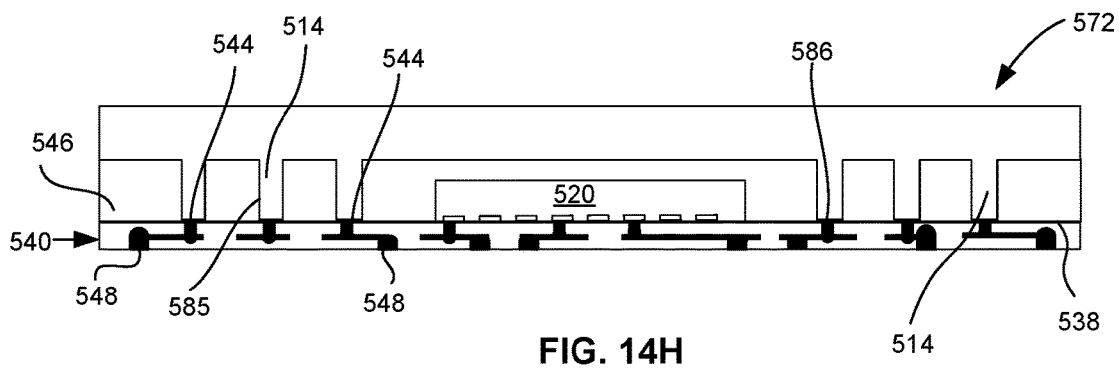

The microelectronic element 520 and conductive component 572 can be encapsulated, as shown in FIG. 14F. An encapsulant 534 can fill the space between the bottom surface 576 of the conductive component 572, the rear surface 528 of the microelectronic element, the edge surfaces 526a, 526b, 526c, 526d (FIG. 14J) of the microelectronic element 520, and the edge surfaces 585 of each of the conductive interconnection elements 514, 514a (FIG. 14D). In this example, all of the interconnection elements 514, 514*a* are encapsulated. Once encapsulated, the carrier 570 can be removed to expose an interconnection surface 588. As shown in FIG. 14G, an interconnect surface 588 includes the ends 586 of the interconnection elements 514, 514*a* the bond pads 522, and bottom surface 538 of the encapsulant 534. An optional redistribution structure 540 can be manufactured, as previously disclosed herein, and joined to and electrically connected with the interconnection surface 588. (FIG. 14H). Front contacts 544 of the redistribution structure 540 can be juxtaposed with the ends 586 of the interconnection element 514, 514*a* and the bond pads 522 of the microelectronic element 520.

Figure 14I:
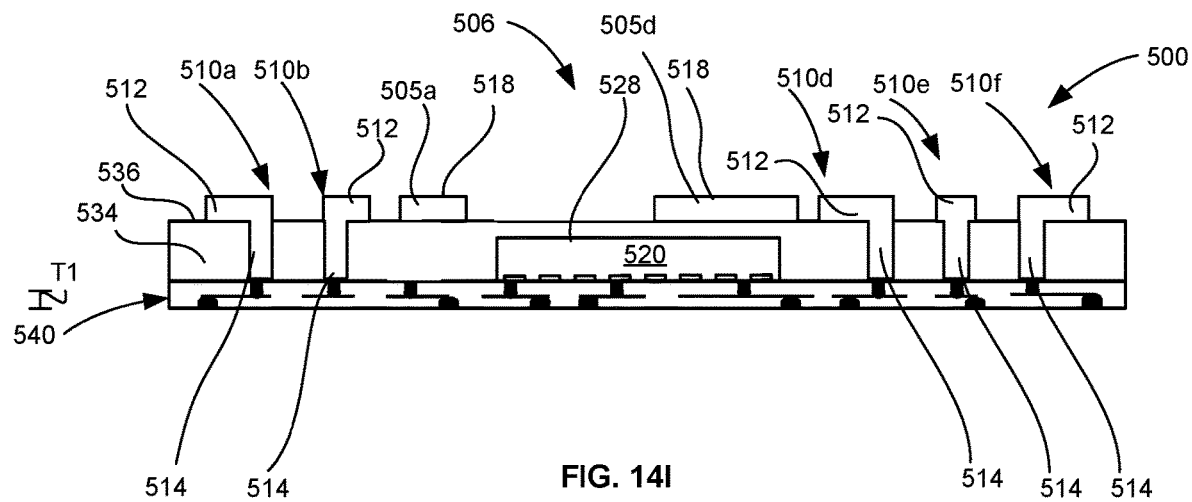

The conductive component 572 can be etched so as to form a plurality of back side conductive components, including back side conductive components 510*a*, 510*b*, 510*c*, 510*d*, 510*e*, 510*f*. As in previous examples, conductive components 510*a*, 510*b*, 510*d*, 510*e*, 510*f* can include respective back side routing lines 512 that are integrally formed with the interconnection elements 514 as shown in FIG. 14I. As in previous examples, back side routing lines 512 can extend along the top surface 536 of the encapsulant 534.

Figure 14J:
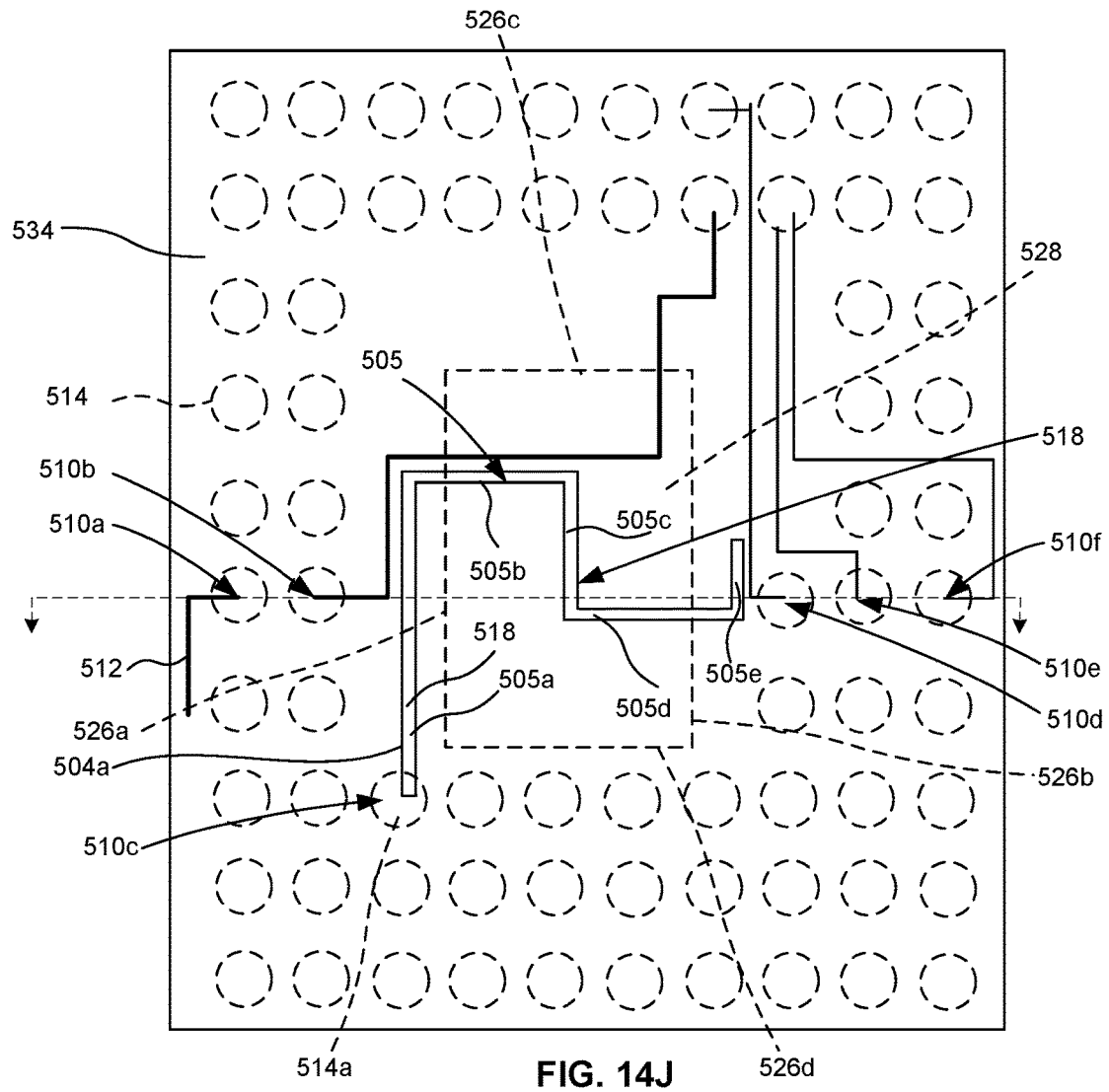

At least one of the back side conductive components, such as back side conductive component 510*c*, can be patterned to form an antenna 518. FIG. 14J, a top down view of the in-process unit of FIG. 14I, illustrates the patterning of the back side routing lines from the conductive component 572. Back side conductive component 510*c* comprises an interconnection element 514*a* and a continuous back side routing line 505 that is patterned to form an antenna 518. Antenna 518 overlies encapsulant 534 and microelectronic element 520. As shown in this example, antenna routing line 505 extends across top surface 536 of the encapsulant 536. Antenna routing line 505 further overlies and extends across the rear surface 528 of microelectronic element 520, and in this example, at least a portion of antenna routing line 505 can overlie the top surface 536 of encapsulant 534 and microelectronic element 520. Antenna routing line 505 may be comprised of multiple shorter routing lines. For example, shorter routing lines 505*a*, 505*b*, 505*c*, 505*d*, 505*e* collectively form the antenna back side routing line 505 and the antenna 518. Each of the shorter routing lines 505*a*, 505*b*, 505*c*, 505*d*, 505*e* may be joined end to end by a directly adjacent routing line. In this example, each of the shorter routing lines change direction from the prior shorter routing line and extends perpendicular to the prior shorter routing line. In other examples, fewer shorter routing lines, a greater number of shorter routing lines, and any shape of routing line can be provided. For example, antenna routing line may be circular and include only a single routing line that does not change directions and instead extends continuously in the same direction in a helical pattern.

As in previous examples, the back side routing lines of some other back side conductive components may be patterned as traces. As shown in FIG. 14J, the back side routing lines 512 of back side conductive components, such as back side conducive components 510*a*, 510*b*, 510*d*, 510*e*, 510*f* are traces. One or more of the back side conductive components 510*a*, 510*b*, 510*d*, 510*e*, 510*f* or other back side conductive components in the microelectronic assembly may further provide connections that can carry signal, power and/or ground. It is to be appreciated that the back side routing lines in FIG. 14J are exemplary and numerous other modifications can be made to the patterning of the back side routing layer.

Figure 14K:
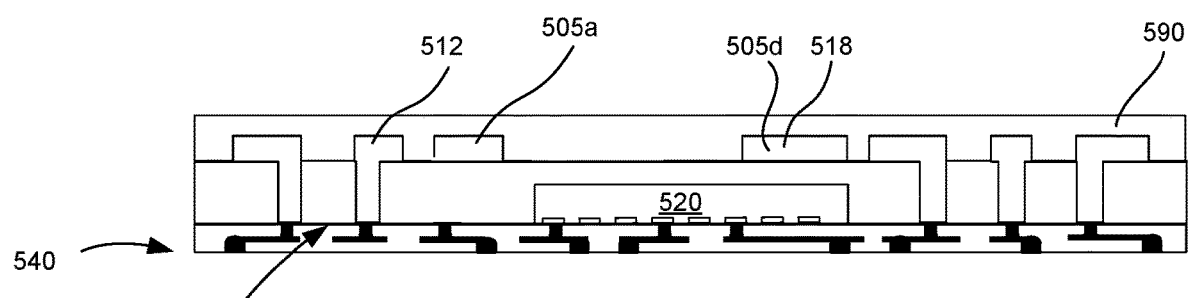
Figure 14L:
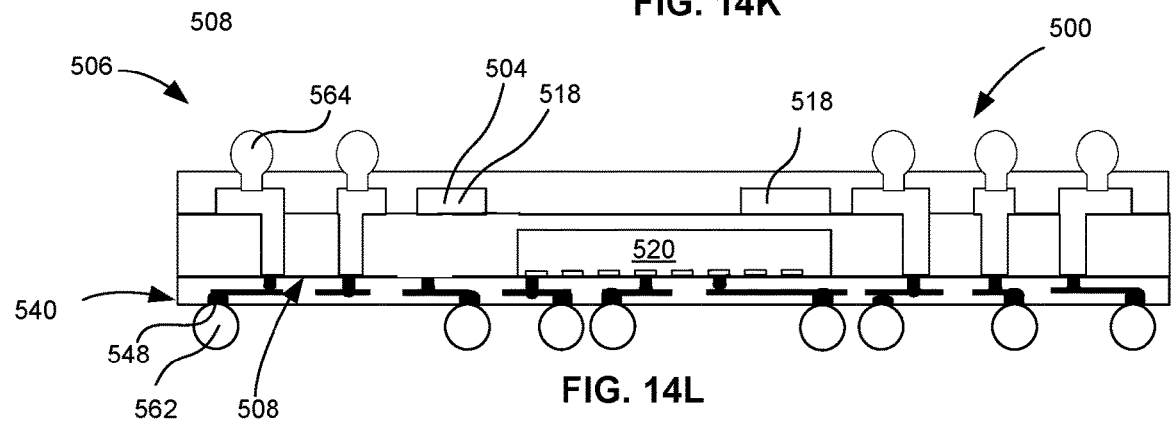

Once patterning of the base 580 of the conductive component 572 is complete, a dielectric layer 590, as shown in FIG. 14K, can be provided over the back side routing lines 512 and antenna back side routing line 505 (such as back side routing lines 505*a*, 505*b* and 505*c* (FIG. 14J), and 505*d*. Openings (FIG. 14K) may be provided therein to allow for conductive bumps 564 to be provided at the first side 506 of the assembly 500. (FIGS. 14K and 14L.) Conductive bond bumps 562 can also be joined with the rear contracts 548 of the redistribution structure 540 at the second side 508 of the assembly 500.

It is to be appreciated that in this example, patterning of the conductive component 572 occurred after the redistribution layer 540 was provided. In other examples, the back side conductive component 572 may be patterned prior to the attachment of the redistribution layer 540. For example, patterning may occur after encapsulation (FIG. 14F). In such example, patterning can further occur prior to removal of the carrier layer 570 (FIG. 14G). Optionally, after removal of the carrier layer 570, another carrier layer can be provided or in process unit may be directly attached to a circuit board or other external component.

A manufacturing process that incorporates back side conductive components, such as back side conductive components 510 that include an antenna 518 integrally formed at the same time from a pre-processed unitary structure, as opposed to being formed by plating the antenna pattern or the like, allows for improvements over known assemblies, including a reduction in the overall cost of the assembly, simplified fabrication, improvements on package warpage, small form factor, and various other improvements.

Figure 15:
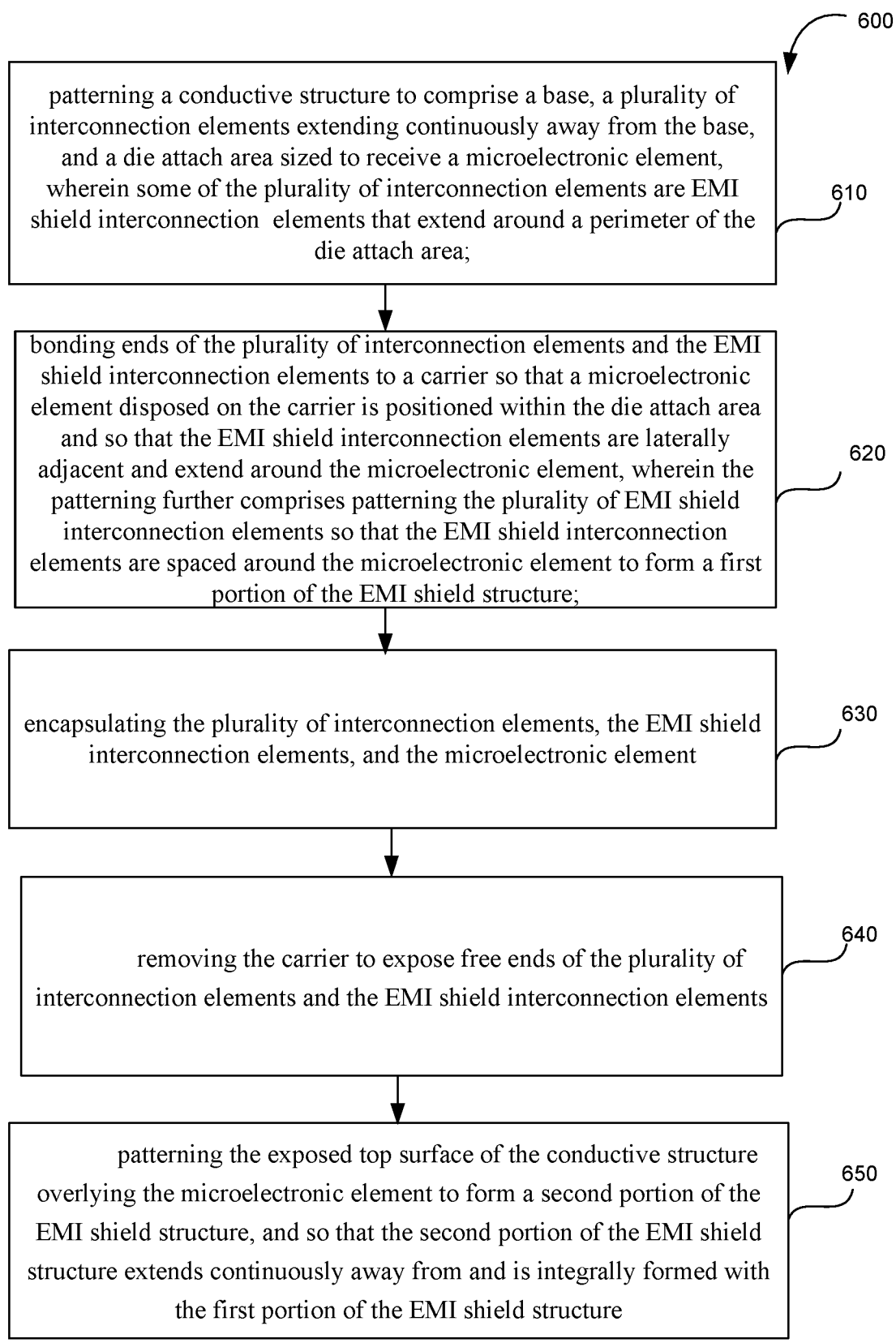
FIG. 15 is an example method of manufacturing a microelectronic assembly in accordance with aspects of the disclosure.

Turning now to FIG. 15, a method of manufacturing a microelectronic assembly with an electromagnetic shield structure is described. At box 610, a conductive structure may be patterned to comprise a base, a plurality of interconnection elements extending continuously away from the base, and a die attach area sized to receive a microelectronic element. Some of the plurality of interconnection elements may be EMI shield interconnection elements that extend around a perimeter of the recessed area.

At box 620, ends of the plurality of interconnection elements and the EMI shield interconnection elements may be bonded to a carrier so that a microelectronic element disposed on the carrier is positioned within the die attach area and so that the EMI shield interconnection elements are laterally adjacent and extend around the microelectronic element. The patterning the conductive structure may further comprise patterning the plurality of EMI shield interconnection elements so that the EMI shield interconnection elements are spaced around the microelectronic element to form a first portion of the EMI shield structure.

At box 630, the plurality of interconnection elements, the EMI shield interconnection elements, and the microelectronic element may be encapsulated At box 640, the carrier may be removed to expose the free ends of the plurality of interconnection elements and the EMI shield interconnection elements.

Figure 16:
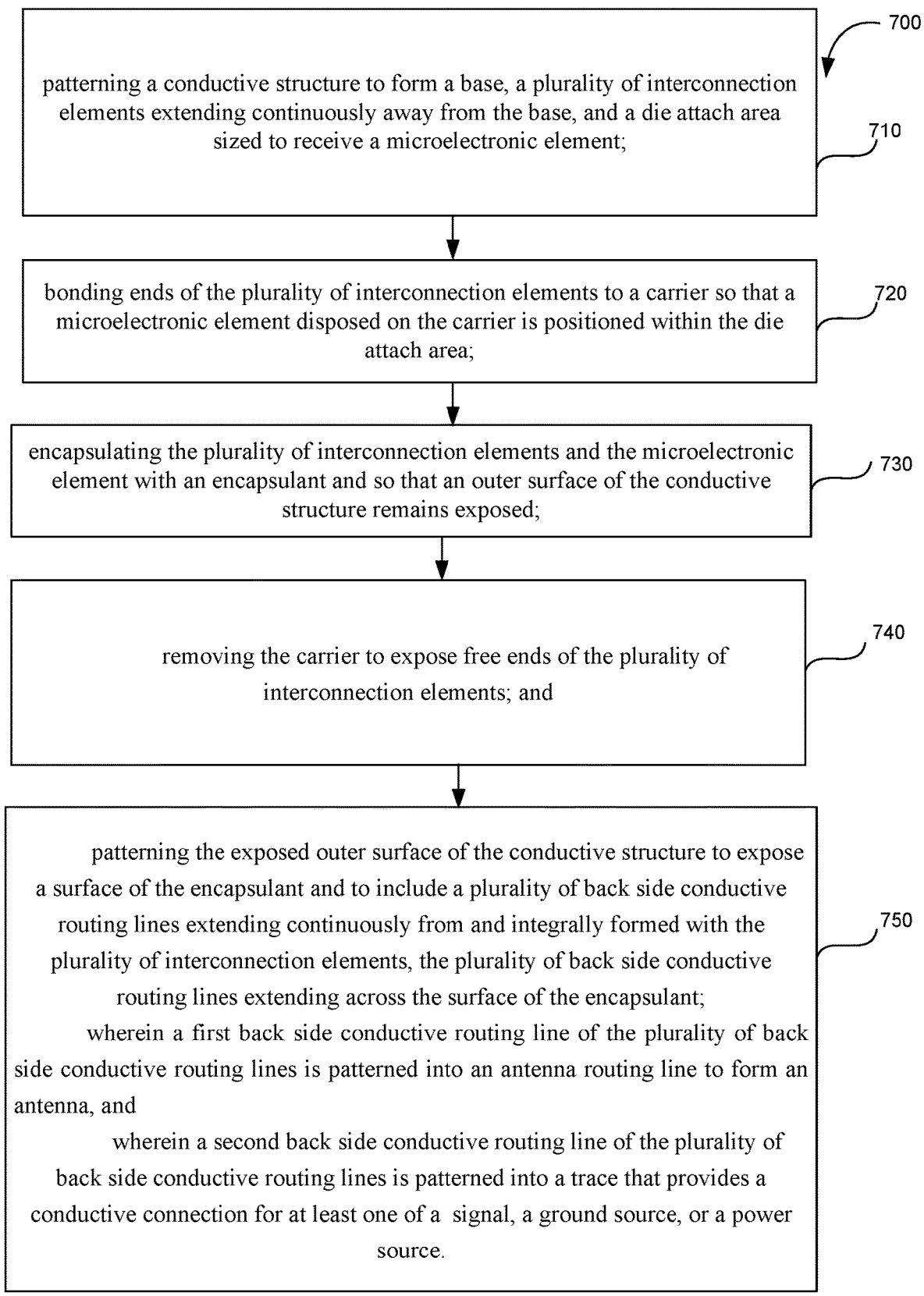
FIG. 16 is an example method of manufacturing a microelectronic assembly in accordance with aspects of the disclosure.

At box 650, the exposed top surface of the conductive structure overlying the microelectronic element may be patterned to form a second portion of the EMI shield structure, and so that the second portion of the EMI shield structure extends continuously away from and is integrally formed with the first portion of the EMI shield structure, FIG. 16 illustrates a method of manufacturing a microelectronic assembly that includes an antenna. At block 710, a conductive structure may be patterned to form a base, a plurality of interconnection elements that extend continuously away from the base, and a die attach area sized to receive a microelectronic element. Ends of the plurality of interconnection elements may be bonded to a carrier so that a microelectronic element disposed on the carrier is positioned within the die attach area at block 720.

The plurality of interconnection elements and the microelectronic element may be encapsulated with an encapsulant and so that an outer surface of the conductive structure remains exposed at block 730. The carrier may be removed to expose the free ends of the plurality of interconnection elements at block 740.

At block 750, the exposed outer surface of the conductive structure may be patterned to expose a surface of the encapsulant and to include a plurality of conductive back side routing lines that extend continuously from and are integrally formed with the plurality of interconnection elements. The plurality of conductive back side routing lines may extend across the surface of the encapsulant. The first back side conductive routing line of the plurality of conductive back side routing lines may be patterned into an antenna routing line to form an antenna. A second back side conductive routing line of the plurality of conductive back side routing lines is patterned into a trace that can carry at least one of a signal, ground, or power.

Figure 17:
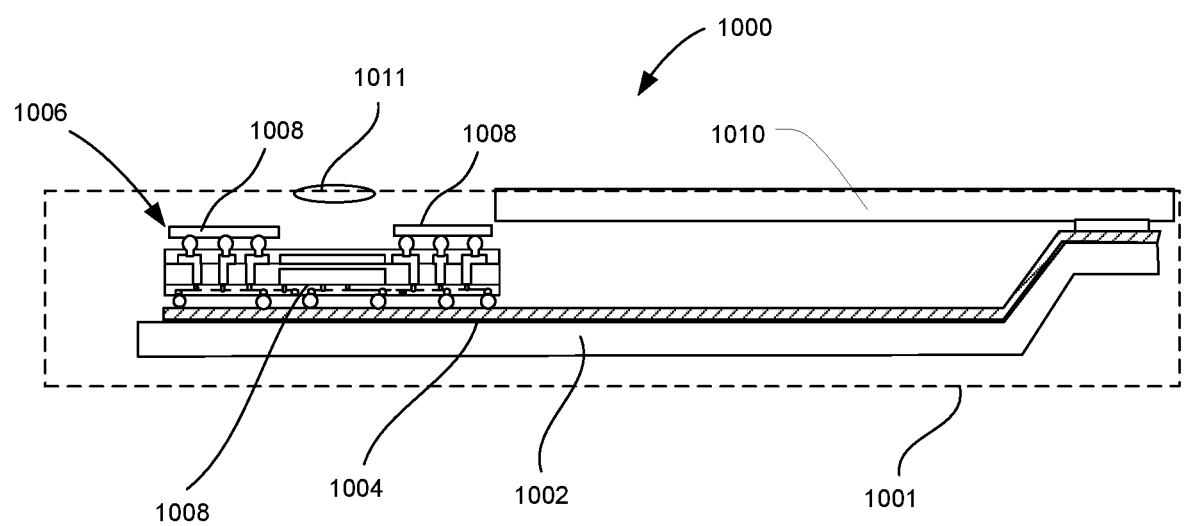
FIG. 17 is a schematic depiction of a system according to one embodiment of the disclosure.

The assemblies and methods described above with reference to FIGS. 1-16 above can be utilized in construction of diverse electronic systems, such as the system 1000 shown in FIG. 17. For example, the system 1000 in accordance with a further embodiment of the invention includes one or more modules or components 1006 such as the assemblies as described above, in conjunction with other electronic components 1010 and 1011.

In the exemplary system 1000 shown, the system can include a circuit panel, motherboard, or riser panel 1002 such as a flexible printed circuit board, and the circuit panel can include numerous conductors 1004, of which only one is depicted in FIG. 16, interconnecting the modules or components 1006, 1010, and 1011 with one another. Such a circuit panel 1002 can transport signals to and from each of the microelectronic packages and/or microelectronic assemblies included in the system 1000. However, this is merely exemplary; any suitable structure for making electrical connections between the modules or components 1006 can be used.

In a particular embodiment, the system 1000 can also include a processor such as the semiconductor chip 1008, such that each module or component 1006 can be configured to transfer a number N of data bits in parallel in a clock cycle, and the processor can be configured to transfer a number M of data bits in parallel in a clock cycle, M being greater than or equal to N. Additionally, other chip packages, such as chip packages 1008' may be provided within the system, as well.

In the example depicted in FIG. 17, the component 1008 is a semiconductor chip and component 1010 is a display screen, but any other components can be used in the system 1000. Of course, although only two additional components 1010 and 1011 are depicted in FIG. 8 for clarity of illustration, the system 1000 can include any number of such components.

Modules or components 1006 and components 1008, 1010, and 1011 can be mounted in a common housing 1001, schematically depicted in broken lines, and can be electrically interconnected with one another as necessary to form the desired circuit. The housing 1001 is depicted as a portable housing of the type usable, for example, in a cellular telephone or personal digital assistant, and screen 1010 can be exposed at the surface of the housing. In embodiments where a structure 1006 includes a light-sensitive element such as an imaging chip, a component 1011, such as a lens or other optical device also can be provided for routing light to the structure. Again, the simplified system shown in FIG. 17 is merely exemplary; other systems, including systems commonly regarded as fixed structures, such as desktop computers, routers and the like can be made using the structures discussed above.

According to an aspect of the disclosure, a method of manufacturing a microelectronic package with an integrally formed EMI shield structure comprises patterning a conductive structure to comprise a base, a plurality of interconnection elements extending continuously away from the base, and a die attach area sized to receive a microelectronic element, wherein some of the plurality of interconnection elements are EMI shield interconnection elements that extend around a perimeter of the die attach area; bonding ends of the plurality of interconnection elements and the EMI shield interconnection elements to a carrier so that a microelectronic element disposed on the carrier is positioned within the die attach area and so that the EMI shield interconnection elements are laterally adjacent and extend around the microelectronic element, wherein the patterning further comprises patterning the plurality of EMI shield interconnection elements so that the EMI shield interconnection elements are spaced around the microelectronic element to form a first portion of the EMI shield structure; encapsulating the plurality of interconnection elements, the EMI shield interconnection elements, and the microelectronic element with an encapsulant and so that an outer surface of the conductive structure remains exposed; removing the carrier to expose free ends of the plurality of interconnection elements and the EMI shield interconnection elements; and patterning the exposed outer surface of the conductive structure overlying the microelectronic element to form a second portion of the EMI shield structure, and so that the second portion of the EMI shield structure extends continuously away from and is integrally formed with the first portion of the EMI shield structure; and/or patterning the exposed outer surface of the conductive structure to form the second part of the EMI shield occurs after the encapsulating; and/or the second portion of the EMI shield structure extends along and overlies surface of the encapsulant; and/or the patterning the exposed outer surface to form the second portion further comprises patterning EMI routing lines that extend continuously from the EMI shield interconnection elements; and/or the patterning the exposed outer surface further comprises patterning a first set of EMI shield routing lines to extend in parallel to one another and patterning a second set of EMI shield routing lines to extend in a direction perpendicular to the first set so as to form a grid pattern; and/or etching a monolithic conductive material to form the conductive structure comprises etching the monolithic conductive material to form the plurality of interconnections; and/or the patterning comprises patterning the exposed outer surface to define a continuous planar surface that overlies the microelectronic element and that extends continuously from the EMI shield interconnection elements; and/or patterning the exposed outer surface of the conductive structure to form an antenna pattern extending across a surface of the encapsulant and connected to one of the plurality of interconnection elements; and/or the patterning the outer surface of the conductive structure to form the antenna pattern further comprises patterning a portion of the outer surface of the conductive structure that is spaced away from the EMI shield interconnection elements; and/or the plurality of EMI shield interconnections are spaced apart from one another to form a plurality of recessed areas therebetween, and wherein the encapsulating further comprises filling the plurality of recessed areas with the encapsulant, and wherein the patterning exposes a surface of the encapsulant.

According to another aspect of the disclosure, a microelectronic assembly comprises a microelectronic element, a plurality of back side conductive components and an encapsulant. The microelectronic element may have an active front surface, an opposed rear surface, and opposed edge surfaces extending between the front and rear surface. At least some of the plurality of back side conductive components are EMI shield back side conductive components. The EMI shield back side conductive components may further comprising EMI shield interconnection elements and at least one EMI shield back side routing line, the EMI shield back side conductive components forming an EMI shield structure adjacent at least one of the edge surfaces and the rear surface of the microelectronic element; and an encapsulant surrounding at least the opposed edge surfaces of the microelectronic element and the EMI shield interconnection elements. The EMI shield interconnection elements are configured to form a first portion of the EMI shield structure, wherein the at least one EMI shield back side routing line overlies the rear surface of the microelectronic element and forms a second portion of the EMI shield structure, and wherein the at least one back side routing line extends continuously from at least one of the EMI shield interconnection elements and along a surface of the encapsulant; and/or the at least one EMI shield back side routing line is a single routing line overlying a rear surface of the microelectronic element and extending away from a corresponding one of the EMI shield interconnection elements; and/or the at least one EMI shield back side routing line comprises an EMI shield back side routing line that forms a major surface of the EMI shield structure, the major surface being a continuous planar surface extending from and joined to each of the EMI shield interconnection elements; and/or the at least one EMI shield back side routing line is a plurality of EMI shield back side routing lines, and wherein each of the plurality of EMI shield back side routing lines extends continuously from a corresponding one of the EMI shield interconnection elements; and/or the plurality of EMI shield back side routing lines are arranged in a grid pattern; and/or some of the plurality of EMI shield back side routing lines extend in a horizontal direction and others of the plurality of EMI shield back side routing lines extend in a direction perpendicular to the some of the plurality of EMI shield back side routing lines; and/or other of the plurality of back side conductive components each comprise an interconnection element and traces extending continuously away from the interconnection element and across a surface of the encapsulant; and/or at least one other of the plurality of back side conductive components comprises an interconnection element and a back side routing line that is patterned to form an antenna; and/or the microelectronic element is a first microelectronic element and the assembly further comprises a second microelectronic element, wherein the first microelectronic element is positioned within the EMI shield structure and the second microelectronic element is positioned outside of the EMI shield structure.

According to another aspect, a system further comprises the aforementioned microelectronic assembly and one or more other electronic components electrically connected to the assembly; and/or the system further includes a housing, the assembly and the other electronic components being mounted to the housing.

According to another aspect of the disclosure, method of manufacturing a microelectronic package with an integrally formed antenna comprises patterning a conductive structure to form a base, a plurality of interconnection elements extending continuously away from the base, and a die attach area sized to receive a microelectronic element; bonding ends of the plurality of interconnection elements to a carrier so that a microelectronic element disposed on the carrier is positioned within the die attach area; encapsulating the plurality of interconnection elements and the microelectronic element with an encapsulant and so that an outer surface of the conductive structure remains exposed; removing the carrier to expose free ends of the plurality of interconnection elements; and patterning the exposed outer surface of the conductive structure to expose a surface of the encapsulant and to include a plurality of conductive back side routing lines extending continuously from and integrally formed with the plurality of interconnection elements, the plurality of conductive back side routing lines extending across the surface of the encapsulant; wherein a first conductive back side routing line of the plurality of conductive back side routing lines is patterned into an antenna routing line to form an antenna, and wherein a second conductive back side routing line of the plurality of conductive back side routing lines is patterned into a trace that can carry at least one of a signal, a ground, or a power; and/or the patterning the antenna routing line comprises patterning the antenna routing line to extend in two or more directions across the surface of the encapsulant; and/or the trace carries ground, and the patterning the exposed outer surface further comprises patterning a third back side conductive routing line of the plurality of conductive back side routing lines so as to carry one of the signal or the power; and/or the patterning the exposed outer surface further comprises patterning some of the plurality of conductive back side routing lines into an electromagnetic interference shield structure overlying the microelectronic element.

According to another aspect of the disclosure, an assembly, comprises a microelectronic element having an active front surface, an opposed rear surface, and opposed edge surfaces extending between the front and rear surfaces; a plurality of back side conductive components, each of the plurality comprising an interconnection element and a back side routing line integrally formed with and connected to the interconnection element; and an encapsulant surrounding the microelectronic element and edges of the plurality of back side conductive components, wherein a first back side routing line of a first back side conductive component comprises an antenna pattern, and wherein a second back side routing line of a second back side conductive component comprises a trace that provides a conductive connection for one of a power, a ground, or a signal; and/or some of the plurality of conductive back side routing lines form an electromagnetic interference shield structure overlying the microelectronic element.

As used in this disclosure, terms such as "upper," "lower," "top," "bottom," "above," "below," and similar terms denoting directions, refer to the frame of reference of the components themselves, rather than to the gravitational frame of reference. With the parts oriented in the gravitational frame of reference in the directions shown in the figures, with the top of drawing being up and the bottom of the drawing being down in the gravitational frame of reference, the top surface of the microelectronic element is, indeed, above the bottom surface of the microelectronic element in the gravitational frame of reference. However, when the parts are turned over, with the top of the drawing facing downwardly in the gravitational frame of reference, the top surface of the microelectronic element is below the bottom surface of the microelectronic element in the gravitational frame of reference.

With reference to a dielectric region or a dielectric structure of a component, e.g., circuit structure, interposer, microelectronic element, capacitor, voltage regulator, circuit panel, substrate, etc., as used in this disclosure, a statement that an electrically conductive element is "at" a surface of the carrier, dielectric region, or other component indicates that, when the surface is not covered or assembled with any other element, the electrically conductive element is available for contact with a theoretical point moving in a direction perpendicular to that surface of the dielectric region from outside the dielectric region or component. Thus, a terminal or other conductive element which is at a surface of a dielectric region may project from such surface; may be flush with such surface; or may be recessed relative to such surface in a hole or depression in the dielectric region.

The incorporation of back side conductive components manufactured according to the disclosure herein into microelectronic assemblies can provide improvements over the art. Such assemblies allow for lower cost construction due to the materials needed and a small form factor. Additionally, for assemblies including a redistribution structure, the back side routing layer can counter-balance warpage caused by the redistribution structure. While certain examples were disclosed herein, it should be appreciated that back side routing layers can be further designed for other three-dimensional connections and heat dissipation.

Throughout this disclosure, the directions parallel to the front and rear surfaces of the microelectronic element or redistribution structure are referred to herein as "horizontal" or "lateral" directions, whereas the directions perpendicular to the front and rear surfaces or parallel to the edge surfaces of the microelectronic element are referred to herein as upward or downward directions and are also referred to herein as the "vertical" directions. The directions referred to herein are in the frame of reference of the structures referred to in the disclosure. Thus, these directions may lie at any orientation to the normal or gravitational frame of reference.

Unless otherwise stated, the foregoing alternative examples are not mutually exclusive, but may be implemented in various combinations to achieve unique advantages. Among others, the descriptions of features in one embodiment are understood to be applicable in another embodiment. For example, the discussion of various heights, thicknesses, and general descriptions of similar components or features in one embodiment can be the same in other embodiments, although not required. As these and other variations and combinations of the features discussed above can be utilized without departing from the subject matter defined by the claims, the foregoing description of the embodiments should be taken by way of illustration rather than by way of limitation of the subject matter defined by the claims. In addition, the provision of the examples described herein, as well as clauses phrased as "such as," "including" and the like, should not be interpreted as limiting the subject matter of the claims to the specific examples; rather, the examples are intended to illustrate only one of many possible embodiments. Further, the same or similar reference numbers in different drawings can identify the same or similar elements.

The invention claimed is:

1. A method of manufacturing a microelectronic package with an integrally formed electromagnetic interference ("EMI") shield structure, comprising:
    patterning a conductive structure to comprise a base, a plurality of interconnection elements extending continuously away from the base, and a die attach area sized to receive a microelectronic element, wherein some of the plurality of interconnection elements are EMI shield interconnection elements that extend around a perimeter of the die attach area;
    bonding ends of the plurality of interconnection elements and the EMI shield interconnection elements to a carrier so that a microelectronic element disposed on the carrier is positioned within the die attach area and so that the EMI shield interconnection elements are laterally adjacent and extend around the microelectronic element, wherein the patterning further comprises patterning the plurality of EMI shield interconnection elements so that the EMI shield interconnection elements are spaced around the microelectronic element to form a first portion of the EMI shield structure;
    encapsulating the plurality of interconnection elements, the EMI shield interconnection elements, and the microelectronic element with an encapsulant and so that an outer surface of the conductive structure remains exposed;
    removing the carrier to expose free ends of the plurality of interconnection elements and the EMI shield interconnection elements; and
    patterning the exposed outer surface of the conductive structure overlying the microelectronic element to form a second portion of the EMI shield structure, and so that the second portion of the EMI shield structure extends continuously away from and is integrally formed with the first portion of the EMI shield structure.

2. The method of claim 1, wherein the patterning the exposed outer surface of the conductive structure to form the second portion of the EMI shield structure occurs after the encapsulating.

3. The method of claim 1, further comprising the second portion of the EMI shield structure extending along and overlying a surface of the encapsulant.

4. The method of claim 2, wherein the patterning the exposed outer surface to form the second portion further comprises patterning EMI shield routing lines that extend continuously from the EMI shield interconnection elements.

5. The method of claim 4, wherein the patterning the exposed outer surface further comprises patterning a first set of EMI shield routing lines to extend in parallel to one another and patterning a second set of EMI shield routing lines to extend in a direction perpendicular to the first set so as to form a grid pattern.

6. The method of claim 1, further comprising etching a monolithic conductive material to form the conductive structure, including etching the monolithic conductive material to form the plurality of interconnection elements.

7. The method of claim 1, wherein the patterning comprises patterning the exposed outer surface to define a continuous planar surface that overlies the microelectronic element and that extends continuously from the EMI shield interconnection elements.

8. The method of claim 1, further comprising patterning the exposed outer surface of the conductive structure to form an antenna pattern extending across a surface of the encapsulant and connected to one of the plurality of interconnection elements.

9. The method of claim 8, wherein the patterning the outer surface of the conductive structure to form the antenna pattern further comprises patterning a portion of the outer surface of the conductive structure that is spaced away from the EMI shield interconnection elements.

10. The method of claim 1, wherein the plurality of EMI shield interconnection elements are spaced apart from one another to form a plurality of recessed areas therebetween, and wherein the encapsulating further comprises filling the plurality of recessed areas with the encapsulant, and wherein the patterning exposes a surface of the encapsulant.

11. A microelectronic assembly, comprising:
a microelectronic element having an active front surface, an opposed rear surface, and opposed edge surfaces extending between the front and rear surfaces;
a plurality of back side conductive components, at least some of the plurality of back side conductive components being EMI shield back side conductive components, the EMI shield back side conductive components further comprising EMI shield interconnection elements and at least one EMI shield back side routing line, the EMI shield back side conductive components forming an EMI shield structure adjacent at least one of the edge surfaces and the rear surface of the microelectronic element; and
an encapsulant surrounding at least the opposed edge surfaces of the microelectronic element and the EMI shield interconnection elements;
wherein the EMI shield interconnection elements are configured to form a first portion of the EMI shield structure, wherein the at least one EMI shield back side routing line overlies the rear surface of the microelectronic element and forms a second portion of the EMI shield structure, and wherein the at least one back side routing line extends continuously from at least one of the EMI shield interconnection elements and along a surface of the encapsulant.

12. The microelectronic assembly of claim 11, wherein the at least one EMI shield back side routing line is a single routing line overlying a rear surface of the microelectronic element and extending away from a corresponding one of the EMI shield interconnection elements.

13. The microelectronic assembly of claim 12, wherein the at least one EMI shield back side routing line comprises an EMI shield back side routing line that forms a major surface of the EMI shield structure, the major surface being a continuous planar surface extending from and joined to each of the EMI shield interconnection elements.

14. The microelectronic assembly of claim 11, wherein the at least one EMI shield back side routing line is a plurality of EMI shield back side routing lines, and wherein each of the plurality of EMI shield back side routing lines extends continuously from a corresponding one of the EMI shield interconnection elements.

15. The microelectronic assembly of claim 14, wherein some of the plurality of EMI shield back side routing lines extend in a horizontal direction and others of the plurality of EMI shield back side routing lines extend in a direction perpendicular to the some of the plurality of EMI shield back side routing lines.

16. The microelectronic assembly of claim 11, wherein other of the plurality of back side conductive components each comprise an interconnection element and traces extending continuously away from the interconnection element and across a surface of the encapsulant.

17. The microelectronic assembly of claim 11, wherein at least one other of the plurality of back side conductive components comprises an interconnection element and a back side routing line that is patterned to form an antenna.

18. The microelectronic assembly of claim 11, wherein the microelectronic element is a first microelectronic element and the microelectronic assembly further comprises a second microelectronic element, wherein the first microelectronic element is positioned within the EMI shield structure and the second microelectronic element is positioned outside of the EMI shield structure.

19. A system comprising:
an assembly according to claim 10; and
one or more other electronic components electrically connected to the assembly.

20. A system as claimed in claim 19, further comprising a housing, the assembly and the other electronic components being mounted to the housing.

* * * * *